(12) United States Patent
Yuda et al.

(10) Patent No.: US 11,171,150 B2
(45) Date of Patent: Nov. 9, 2021

(54) THREE-DIMENSIONAL MEMORY DEVICE CONTAINING A CHANNEL CONNECTION STRAP AND METHOD FOR MAKING THE SAME

(71) Applicant: SANDISK TECHNOLOGIES LLC, Addison, TX (US)

(72) Inventors: Takashi Yuda, Yokkaichi (JP); Hiroyuki Kamiya, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 47 days.

(21) Appl. No.: 16/295,206

(22) Filed: Mar. 7, 2019

(65) Prior Publication Data
US 2020/0286909 A1  Sep. 10, 2020

(51) Int. Cl.
*H01L 27/11582* (2017.01)
*H01L 27/1157* (2017.01)
(Continued)

(52) U.S. Cl.
CPC .... *H01L 27/11582* (2013.01); *H01L 21/0262* (2013.01); *H01L 21/30608* (2013.01); *H01L 23/5226* (2013.01); *H01L 27/1157* (2013.01); *H01L 27/11565* (2013.01); *H01L 27/11573* (2013.01); *H01L 29/40117* (2019.08); *H01L 27/11519* (2013.01); *H01L 27/11524* (2013.01);
(Continued)

(58) Field of Classification Search
CPC ................................................ H01L 27/11575
See application file for complete search history.

(56) References Cited

U.S. PATENT DOCUMENTS 5,915,167 A   6/1999  Leedy
9,230,980 B2  1/2016  Rabkin et al.
(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Moazzam Hossain
*Assistant Examiner* — Stanetta D Isaac
(74) *Attorney, Agent, or Firm* — The Marbury Law Group PLLC

(57) ABSTRACT

A three-dimensional memory device includes an alternating stack of insulating layers and electrically conductive layers located over a substrate, a memory opening extending through the alternating sack, and a memory opening fill structure located within the memory opening. The memory opening fill structure includes a pedestal channel portion, a memory film overlying the pedestal channel portion, a vertical semiconductor channel located inside the memory film, and a channel connection strap that extends through an opening of the memory film and contacting the pedestal channel portion and the vertical semiconductor channel. The channel connection strap has a topmost surface located below a horizontal plane including a top surface of the vertical semiconductor channel. The channel connection strap portion may be formed by a selective semiconductor growth from physically exposed semiconductor surfaces, and may provide enhanced electrical connection between the pedestal channel portion and the vertical semiconductor channel.

20 Claims, 25 Drawing Sheets

(51) Int. Cl.
*H01L 27/11565* (2017.01)
*H01L 27/11573* (2017.01)
*H01L 21/306* (2006.01)
*H01L 23/522* (2006.01)
*H01L 21/02* (2006.01)
*H01L 21/28* (2006.01)
*H01L 27/11556* (2017.01)
*H01L 27/11519* (2017.01)
*H01L 27/11524* (2017.01)
*H01L 27/11526* (2017.01)

(52) U.S. Cl.
CPC ... *H01L 27/11526* (2013.01); *H01L 27/11556* (2013.01)

(56) References Cited

U.S. PATENT DOCUMENTS

| | | | |
|---|---|---|---|
| 9,331,093 B2 | 5/2016 | Rabkin et al. | |
| 9,425,299 B1 | 8/2016 | Rabkin et al. | |
| 9,524,977 B2 | 12/2016 | Sharangpani et al. | |
| 9,530,785 B1 | 12/2016 | Koka et al. | |
| 9,721,963 B1 | 8/2017 | Rabkin et al. | |
| 9,799,669 B2 | 10/2017 | Rabkin et al. | |
| 9,941,295 B2 | 4/2018 | Rabkin et al. | |
| 10,121,794 B2 | 11/2018 | Gunji-Yoneoka et al. | |
| 2015/0076586 A1 | 3/2015 | Rabkin et al. | |
| 2016/0099250 A1 | 4/2016 | Rabkin et al. | |
| 2016/0111432 A1 | 4/2016 | Rabkin et al. | |
| 2016/0307908 A1 | 10/2016 | Sharangpani et al. | |
| 2016/0358933 A1 | 12/2016 | Rabkin et al. | |
| 2017/0365613 A1 | 12/2017 | Gunji-Yoneoka et al. | |

OTHER PUBLICATIONS

U.S. Appl. No. 15/951,916, filed Apr. 12, 2018, SanDisk Technologies LLC.
U.S. Appl. No. 16/021,899, filed Jun. 28, 2018, SanDisk Technologies LLC.

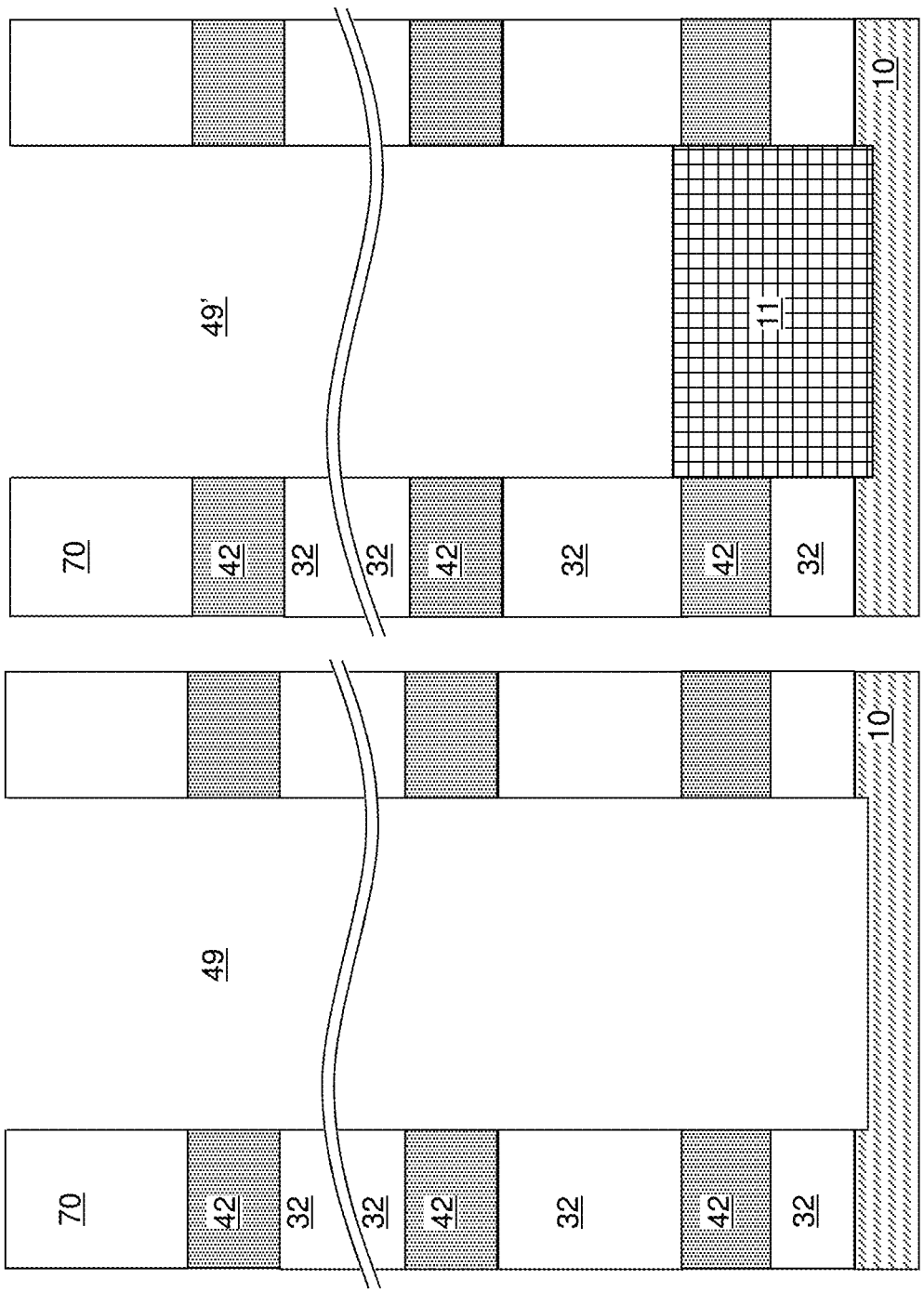

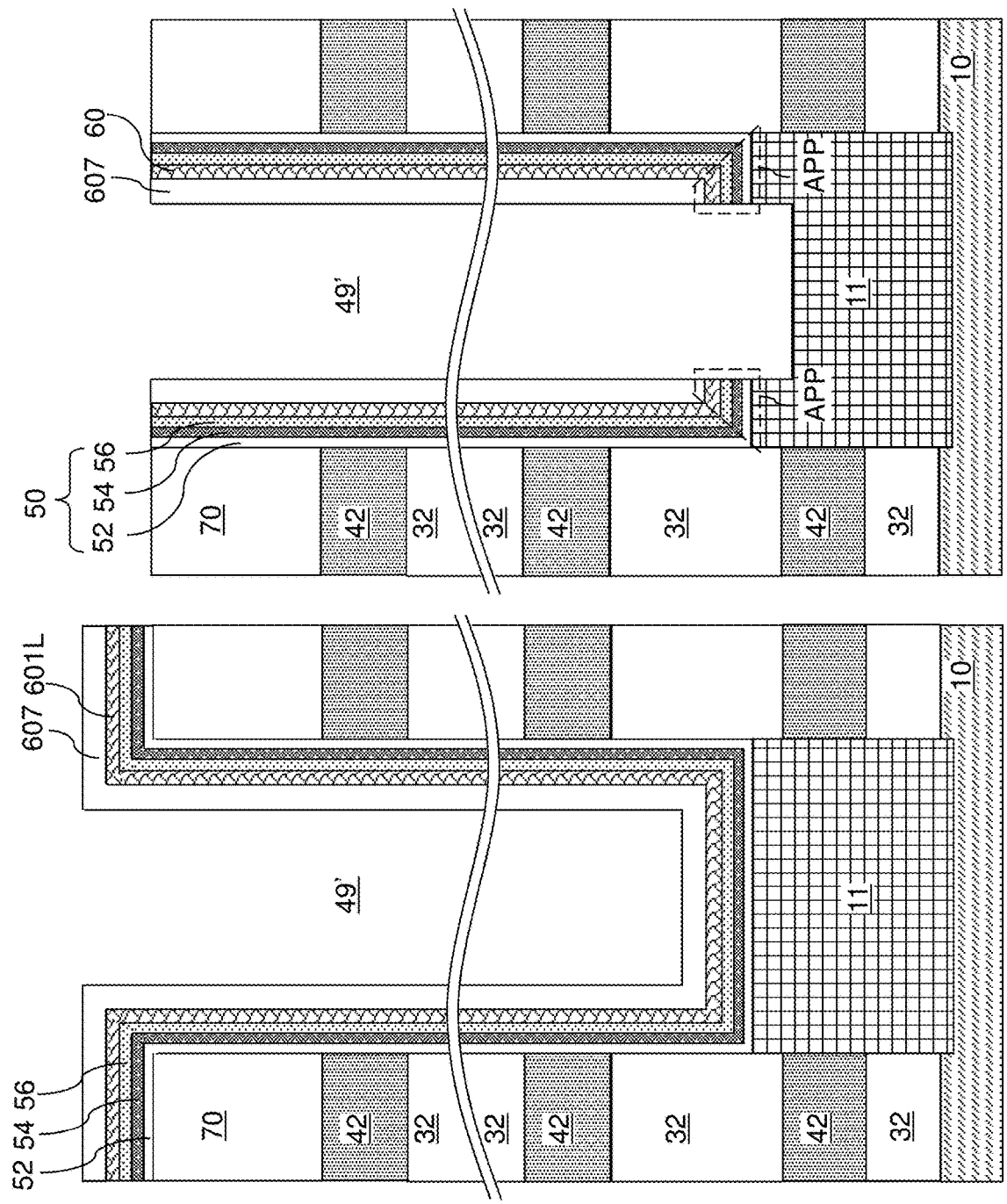

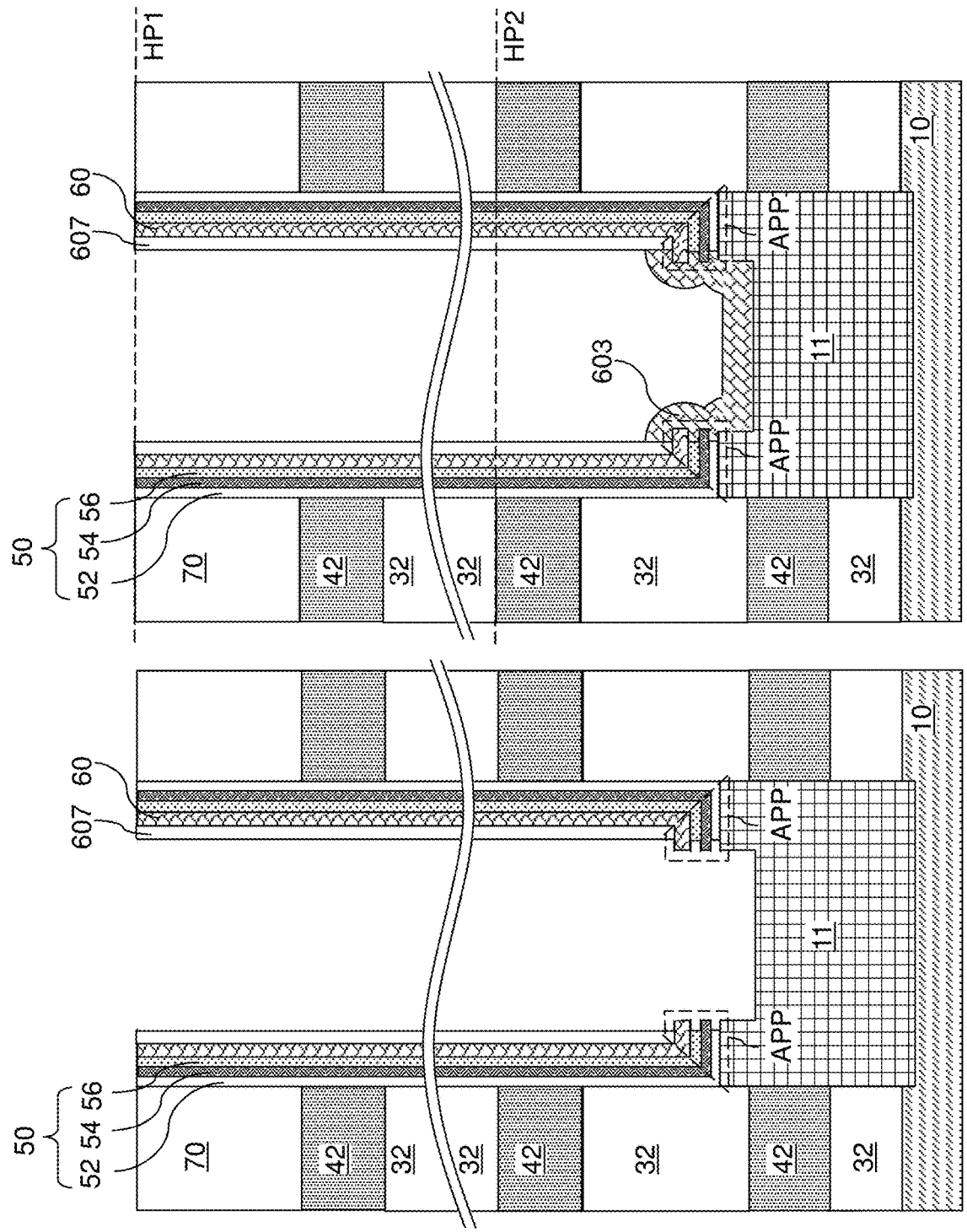

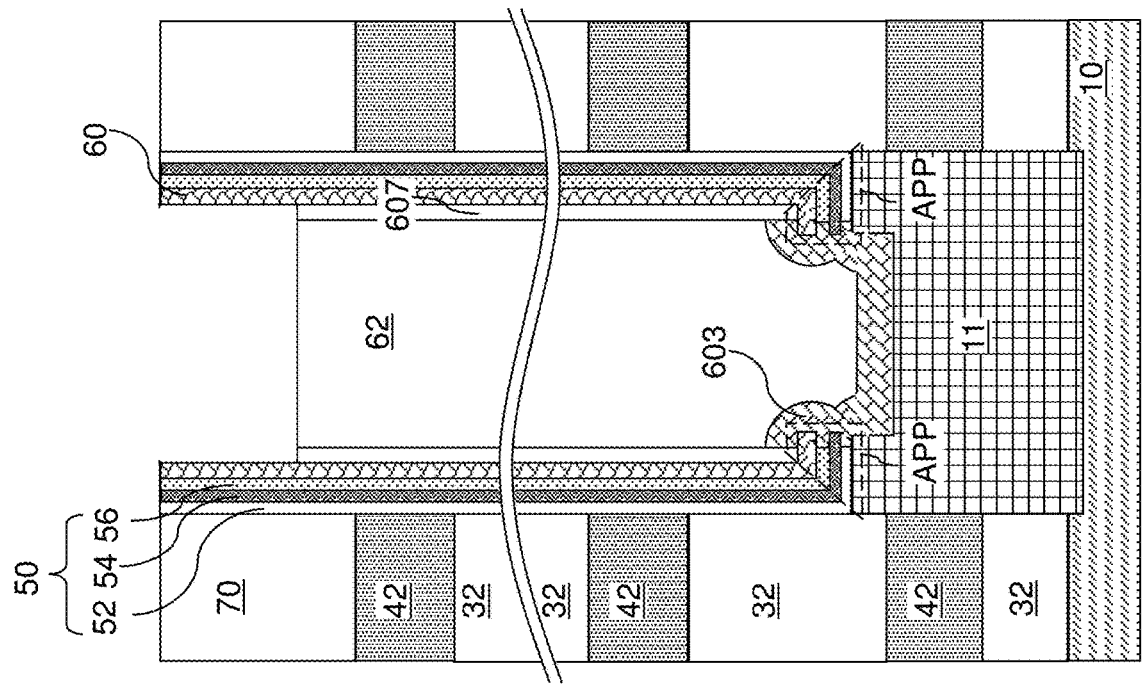
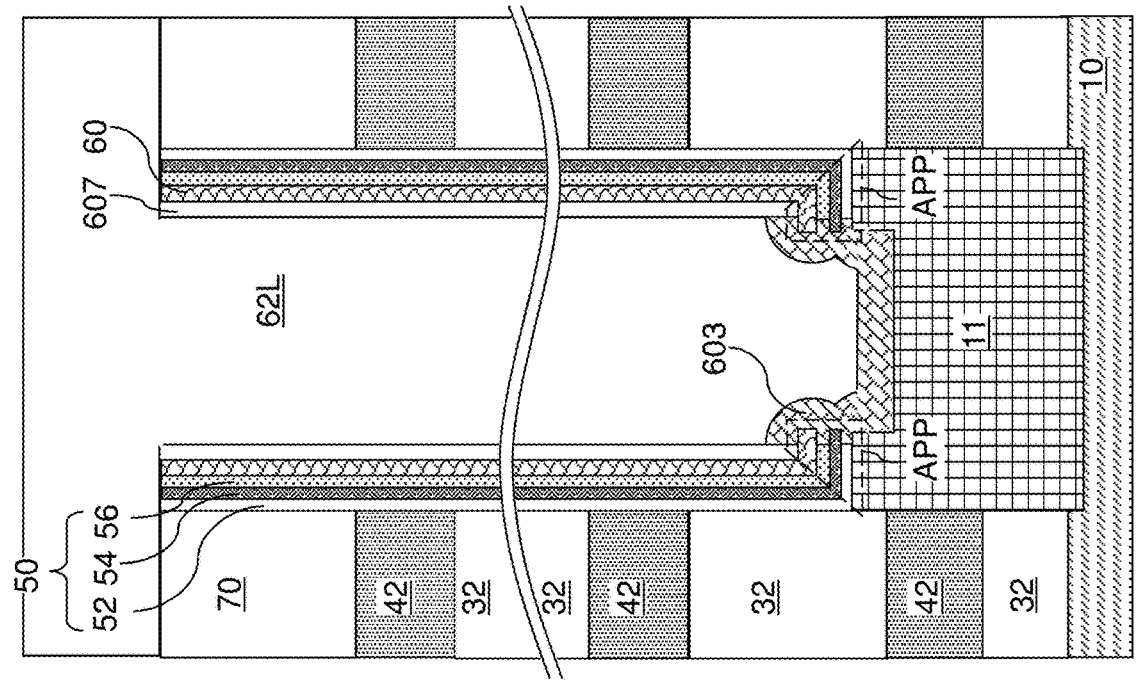

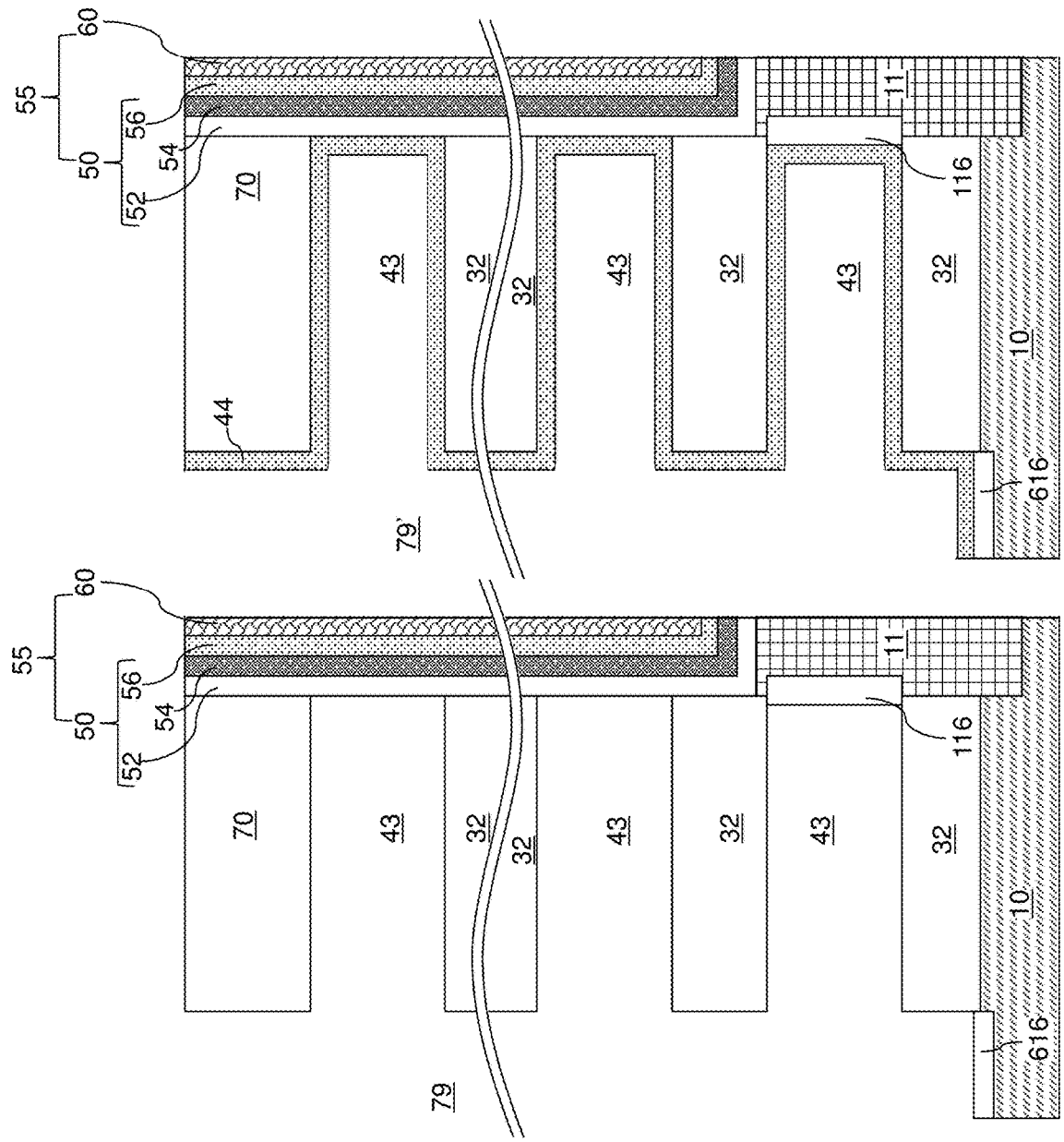

THREE-DIMENSIONAL MEMORY DEVICE CONTAINING A CHANNEL CONNECTION STRAP AND METHOD FOR MAKING THE SAME

FIELD

The present disclosure relates generally to the field of semiconductor devices, and in particular to a three-dimensional memory device containing a channel connection strap and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate; a memory opening extending through the alternating sack; and a memory opening fill structure located within the memory opening, wherein the memory opening fill structure comprises a pedestal channel portion, a memory film overlying the pedestal channel portion, a vertical semiconductor channel located inside the memory film, and a channel connection strap that extends through an opening of the memory film and electrically contacts the pedestal channel portion and the vertical semiconductor channel and having a topmost surface located below a horizontal plane including a top surface of the vertical semiconductor channel.

According to another embodiment of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming a memory opening extending through the alternating sack; and forming a memory opening fill structure within the memory opening, wherein the memory opening fill structure comprises a pedestal channel portion, a memory film overlying the pedestal channel portion, a vertical semiconductor channel located inside the memory film, and a channel connection strap that extends through an opening of the memory film and electrically contacts the pedestal channel portion and the vertical semiconductor channel and having a topmost surface located below a horizontal plane including a top surface of the vertical semiconductor channel.

BRIEF DESCRIPTION OF THE DRAWINGS

FIGS. 5A-5I are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
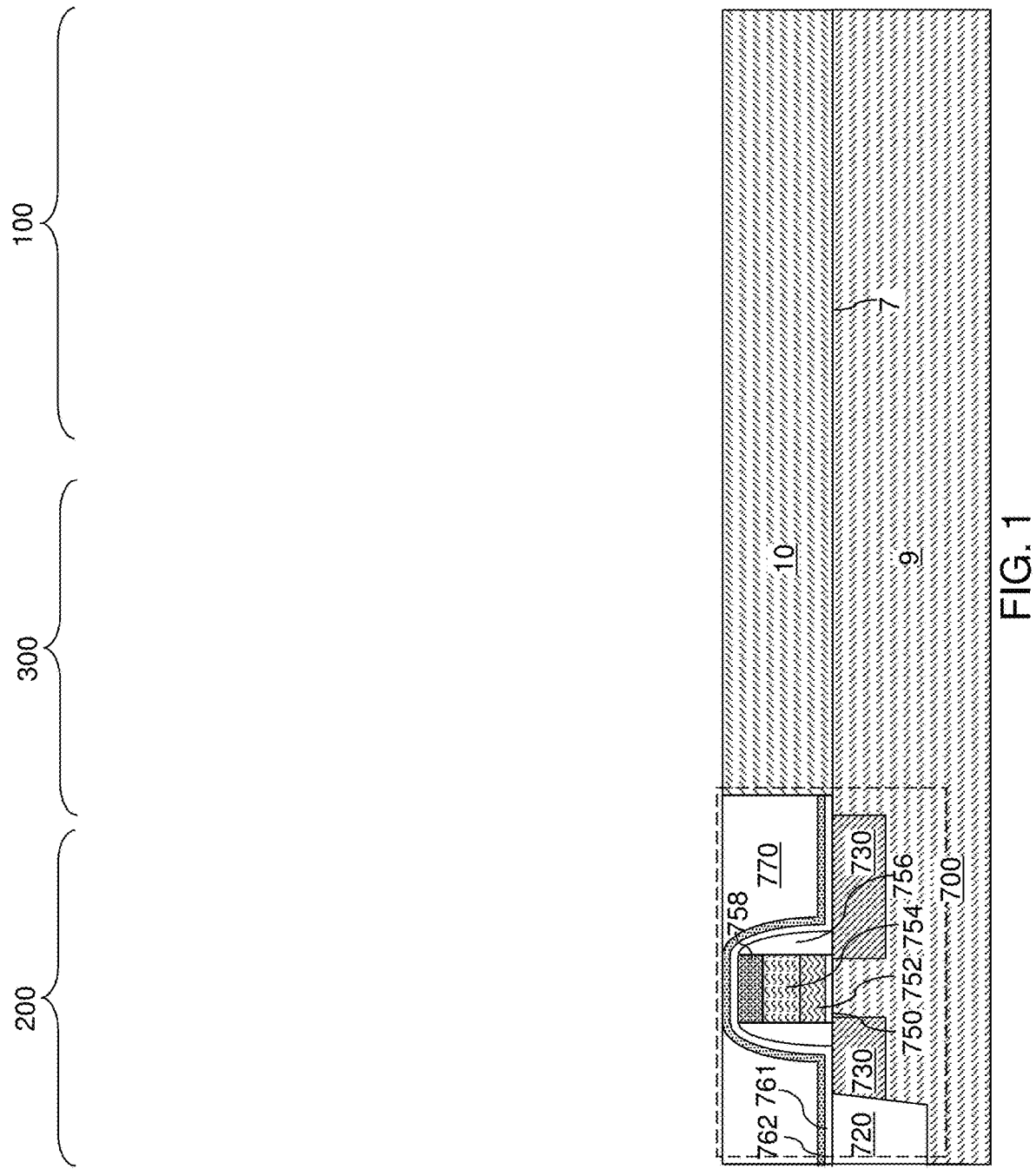
FIG. 1 is a schematic vertical cross-sectional view of an exemplary structure after formation of at least one peripheral device, and a semiconductor material layer according to an embodiment of the present disclosure.

As discussed above, the present disclosure is directed to three-dimensional memory devices including a channel connection strap and methods of making thereof, the various aspects of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which may be a semiconductor substrate. The substrate may include a substrate semiconductor layer 9 and an optional semiconductor material layer 10. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200.

Figure 2:
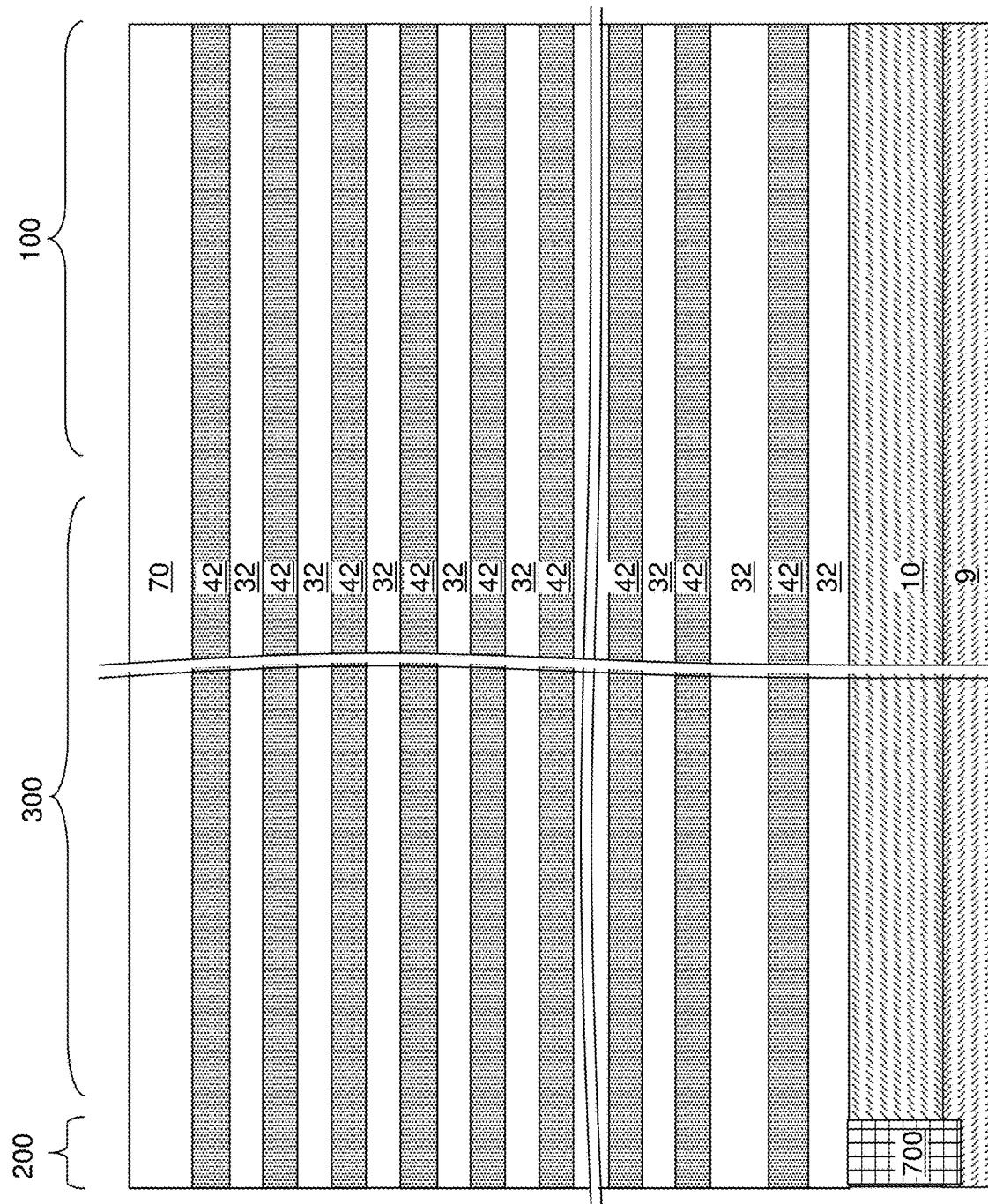
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers may be formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
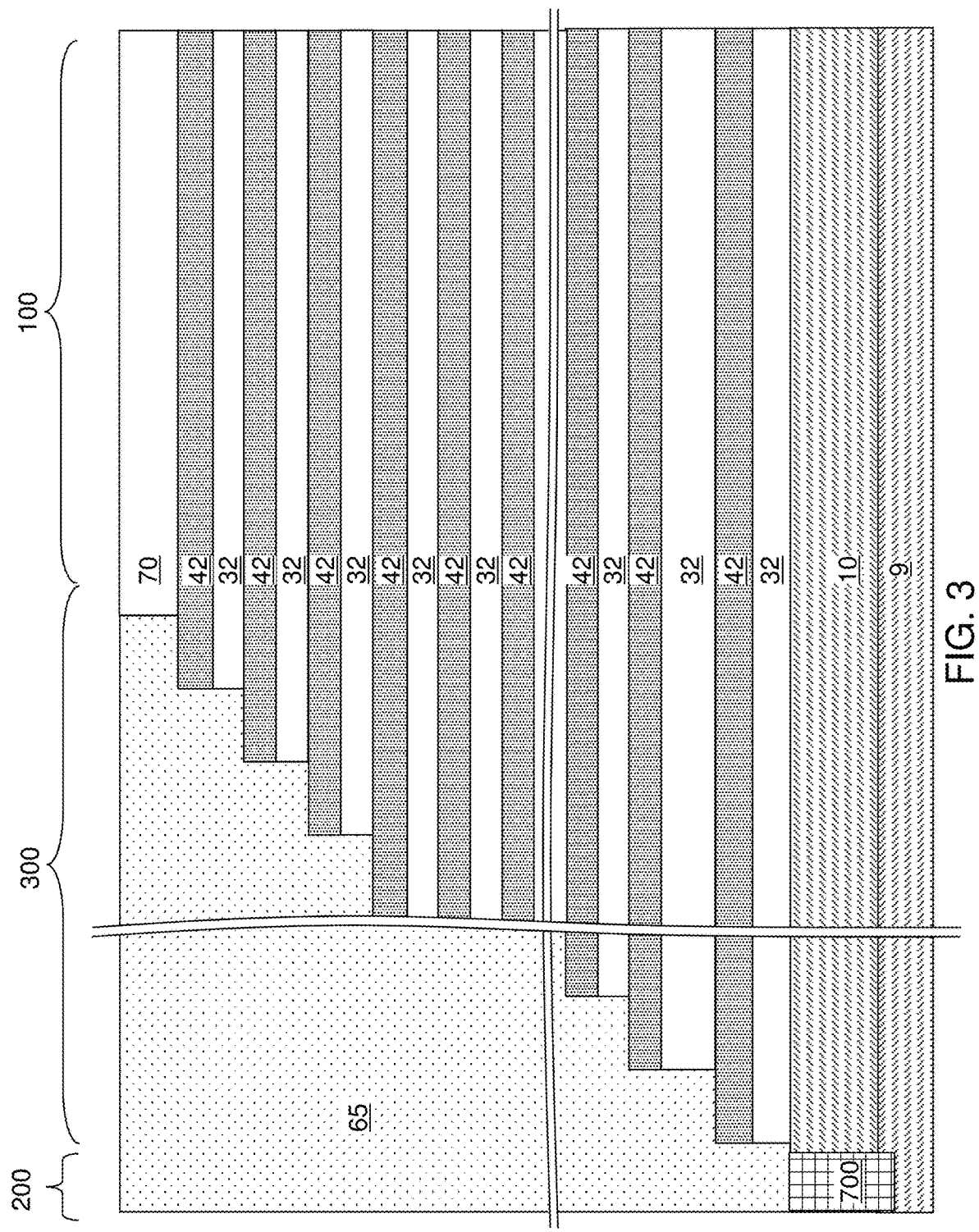
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces may be formed adjacent to the peripheral region 200 of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) may be removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device 700 for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region may include stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 may have a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
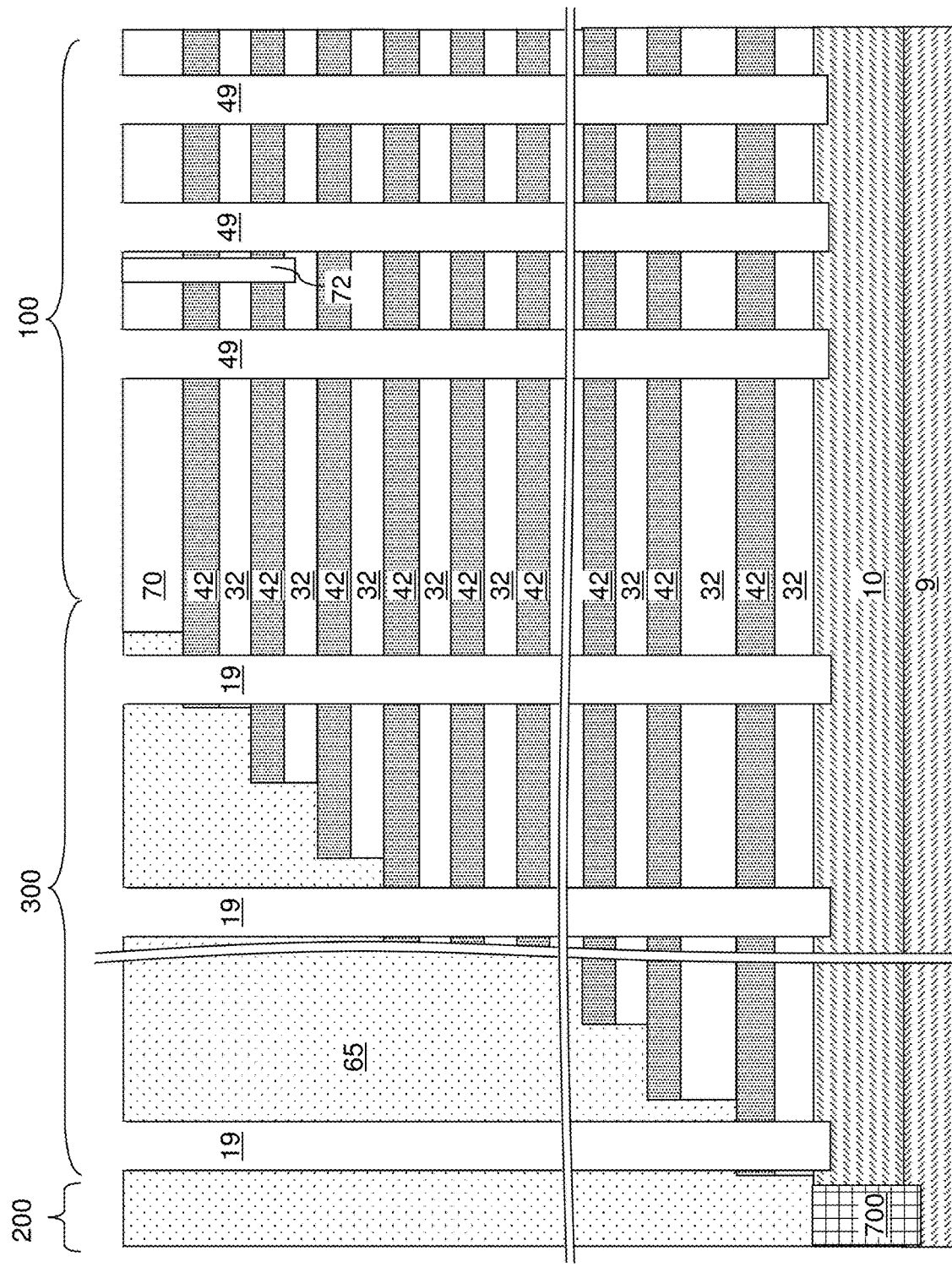
FIG. 4A is a schematic vertical cross-sectional view of the exemplary structure after formation of memory openings and support openings according to an embodiment of the present disclosure.
Figure 4B:
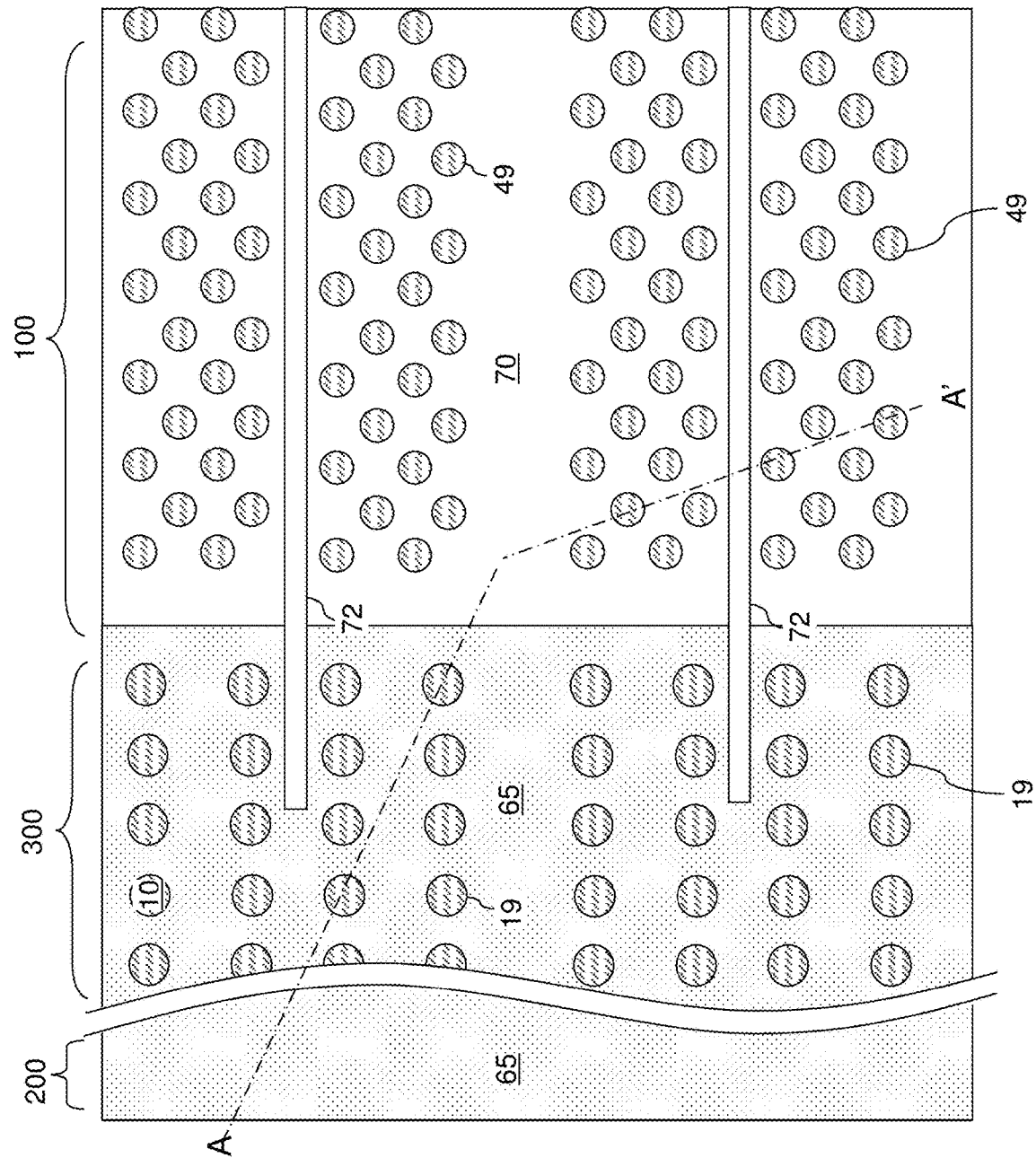
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings may include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack may be etched to form memory openings 49 and support openings 19. As used herein, a "memory opening" refers to a structure in which memory elements, such as a memory stack structure, may be subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, a pedestal channel portion (e.g., an epitaxial pedestal) 11 may be formed at the bottom portion of each memory opening 49 and each support openings 19, for example, by selective epitaxy. Each pedestal channel portion 11 may comprises a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a bottommost sacrificial material layer 42. In this case, a source select gate electrode may be subsequently formed by replacing the bottommost sacrificial material layer 42 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 5C, a continuous dielectric layer stack may include a blocking dielectric layer 52, a charge storage layer 54, a tunneling dielectric layer 56 is formed in the memory openings 49 and over the insulating cap layer 70.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

A continuous semiconductor channel material layer 601L is deposited over the tunneling dielectric layer 56. The continuous semiconductor channel material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the continuous semiconductor channel material layer 601L includes amorphous silicon or polysilicon. The continuous semiconductor channel material layer 601L may be formed by a conformal deposition method such as low pressure chemical vapor deposition (LPCVD). The thickness of the continuous semiconductor channel material layer 601L may be in a range from 2 nm to 10 nm, although lesser and greater thicknesses may also be used. A memory cavity 49' is formed in the volume of each memory opening 49 that is not filled with the deposited material layers (52, 54, 56, 601).

A cover dielectric material layer 607 is formed over the continuous semiconductor channel material layer 601L. The cover dielectric material layer 607 includes a material that may protect vertical portions of the continuous semiconductor channel material layer 601L during a subsequent anisotropic etch process, and may be subsequently removed selective to the material of the continuous semiconductor channel material layer 601L. In one embodiment, the cover dielectric material layer 607 may include silicon oxide, silicon nitride, or silicon oxynitride. The thickness of the cover dielectric material layer 607 may be in a range from 3 nm to 20 nm, such as from 4 nm to 10 nm, although lesser and greater thicknesses may also be used.

Referring to FIG. 5D, an anisotropic etch process may be performed to sequentially etch horizontal portions of the cover dielectric material layer 607, the continuous semiconductor channel material layer 601L, the tunneling dielectric layer 56, the charge storage layer 54, and the blocking dielectric layer 52. The horizontal portions of the cover dielectric material layer 607, the continuous semiconductor channel material layer 601L, and the continuous dielectric layer stack (52, 54, 56) that are located over the pedestal channel portions 11 and over the insulating cap layer 70. A top surface of a pedestal channel portion 11 may be physically exposed underneath an opening in the remaining portions of the cover dielectric material layer 607, the continuous semiconductor channel material layer 601L, and the continuous dielectric layer stack (52, 54, 56) at the bottom of each memory opening 49.

Each remaining portion of the continuous dielectric layer stack (52, 52, 56) in the memory openings constitutes the memory film 50. Each memory film 50 may include a blocking dielectric layer 52, a charge storage layer 54, and a charge storage layer 56. Each remaining portion of the continuous semiconductor channel material layer 601L constitutes a semiconductor channel layer 601. Annular bottom portions of a blocking dielectric layer 52, a charge storage layer 54, a charge storage layer 56, and a semiconductor channel layer 601 located above a periphery of a pedestal channel portion 11 in each memory opening 49 are herein collectively referred to as an annular peripheral portion APP. In one embodiment, each of the blocking dielectric layer 52, the charge storage layer 54, and the tunneling dielectric layer 56 comprises a respective tubular portion and a respective annular plate portion adjoined to a bottom end of the respective tubular portion; and the annular plate portion of the charge storage layer 54 has a narrower opening than an opening through the annular plate portion of the blocking dielectric layer 52, and an opening through the annular plate portion of the tunneling dielectric layer 56. Each remaining portion of the cover dielectric material layer 607 in the memory openings 49 may have a tubular configuration.

Each remaining portion of a semiconductor channel layer 601 constitutes a vertical semiconductor channel 60 through which electrical current may flow when a vertical NAND device including the vertical semiconductor channel 60 is turned on. A top surface of a pedestal channel portion 11, a cylindrical sidewall of the pedestal channel portion 11, and a sidewall of an annular portion of a vertical semiconductor channel 60 may be physically exposed after the anisotropic etch process. A remaining vertical portion of the cover dielectric material layer 607 covers an inner sidewall of the vertical semiconductor channel 60.

Referring to FIG. 5E, an isotropic etchant that etches the materials of the tunneling dielectric layer 56 and the cover dielectric material layer 607 may be applied in an isotropic etch process. For example, if the tunneling dielectric layer 56 and the cover dielectric material layer 607 include silicon oxide materials, physically exposed surfaces of the pedestal channel portions 11, the semiconductor channel layers 601, and the cover dielectric material layers 607 in the memory openings 49 may be treated with an etchant including hydrofluoric acid (such as dilute hydrofluoric acid). The duration of the isotropic etch process may be controlled to recess the annular bottom portion of the tunneling dielectric layer 56 and reduce the thickness of the cover dielectric material layer 607, such that remaining portion of the cover dielectric material layer 607 covers the vertical portion of the semiconductor channel layers 601 within each memory opening. Inner tip regions of the annular bottom portion of each semiconductor channel layers 601 may laterally protrude inward from a recessed sidewall of an underlying annular bottom portion of the tunneling dielectric layer 56.

Each physically exposed surface of the pedestal channel portions 11 and the vertical semiconductor channel 60 may become a hydrogen-terminated surface, which may be a silylated surface in case the pedestal channel portions 11 and the vertical semiconductor channel 60 include silicon. In one embodiment, the etchant including hydrofluoric acid may be used to isotropically recess the cover dielectric material layer 607 and the tunneling dielectric layer 56 and provide silylated surfaces. In case the blocking dielectric layer 52 includes silicon oxide, the blocking dielectric layer 52 may be collaterally recessed during the isotropic recessing of the tunneling dielectric layer 56 and the cover dielectric material layer 607.

Referring to FIG. 5F, a semiconductor material may be selectively deposited on physically exposed semiconductor surfaces while suppressing growth of the semiconductor material from dielectric surfaces. In other words, the semiconductor material is deposited only on the physically exposed surfaces of the pedestal channel portions 11 and the vertical semiconductor channel 60, and does not grow from the surfaces of the cover dielectric material layer 607. Within each memory opening 49, a channel connection strap 603 may be formed by growing a semiconductor material from the top surface of a pedestal channel portions 11, the sidewall of the pedestal channel portion 11, and the sidewall of the annular portions of a vertical semiconductor channel 60 without growth of the semiconductor material from the remaining vertical portions of the cover dielectric material layer 607.

In one embodiment, the channel connection strap 603 may be formed by a low pressure chemical vapor deposition having a deposition time that is shorter than a nucleation time for the semiconductor material on the dielectric material of the cover dielectric material layer 607. In this case, the low pressure chemical vapor deposition process may use a semiconductor precursor gas and an optional dopant gas.

For example, if the channel connection strap 603 comprises silicon, such as amorphous silicon, then the semiconductor precursor gas may include silane, disilane, or dichlorosilane, the etchant gas may include gaseous hydrogen chloride, and the dopant gas, if present, may include a hydride of a dopant atom such as phosphine, arsine, stibine, or diborane. The dopant gas, if used, includes atoms of dopants of the first conductivity type, which is the conductivity type of the pedestal channel portions 11. If the first conductivity type is p-type, diborane may be used as the dopant gas. If the first conductivity type is n-type, phosphine, arsine, or stibine may be used as the dopant gas. In case the dopant gas is not used, thermal diffusion of dopants of the first conductivity type from the pedestal channel portions 11 during a subsequent anneal process may cause the deposited semiconductor material to be doped with dopants of the first conductivity type.

The selective deposition of the semiconductor material on the physically exposed semiconductor surfaces of the pedestal channel portions 11 and the semiconductor channel layers 601 without deposition of the semiconductor material on dielectric surfaces may be effected by using incubation time difference between semiconductor surfaces dielectric surfaces. An "incubation time" refers to a time period between the initiation of flow of a semiconductor precursor gas and the onset of deposition of a semiconductor material derived from decomposition of the semiconductor precursor gas. The incubation time is dependent on the composition and the properties of the deposition surface.

Figure 14A:
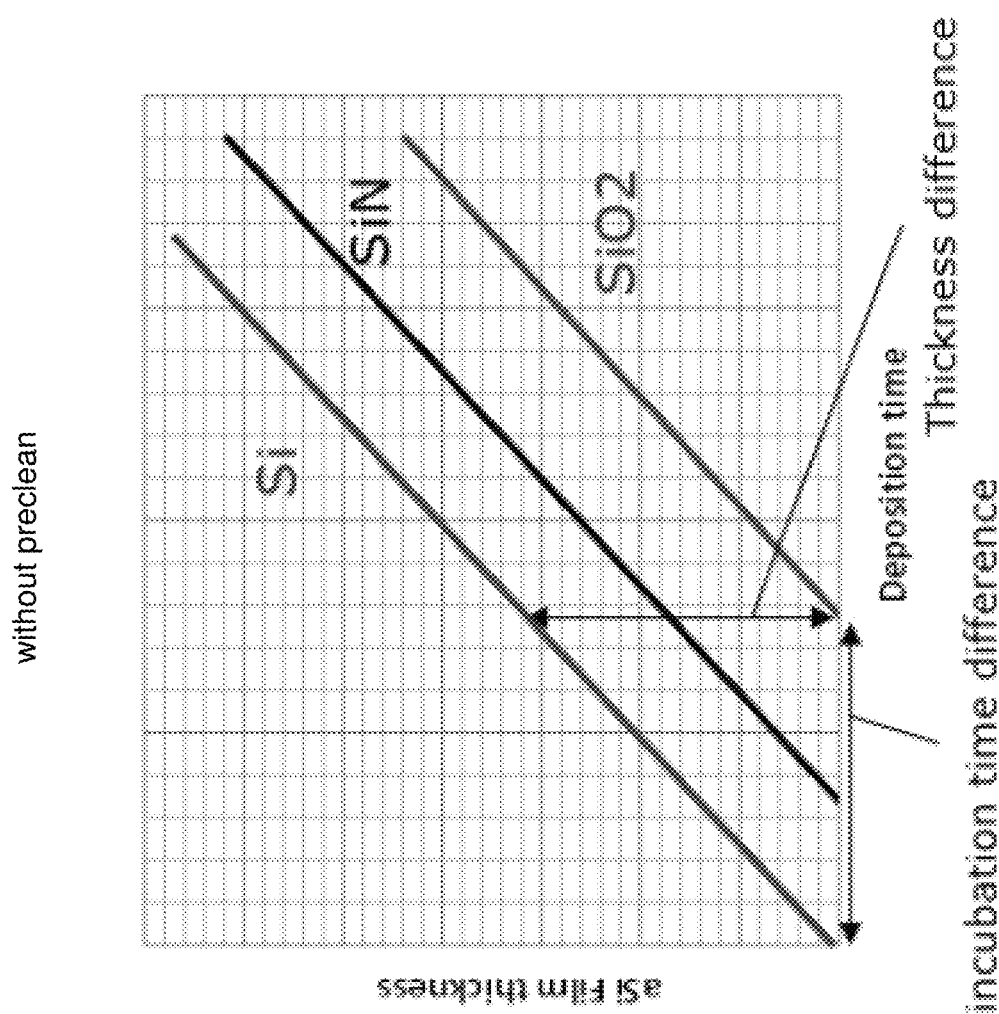
FIG. 14A is a graph illustrating comparison of nucleation times for silicon on surfaces of silicon, silicon oxide, and silicon nitride without any preclean.
Figure 14B:
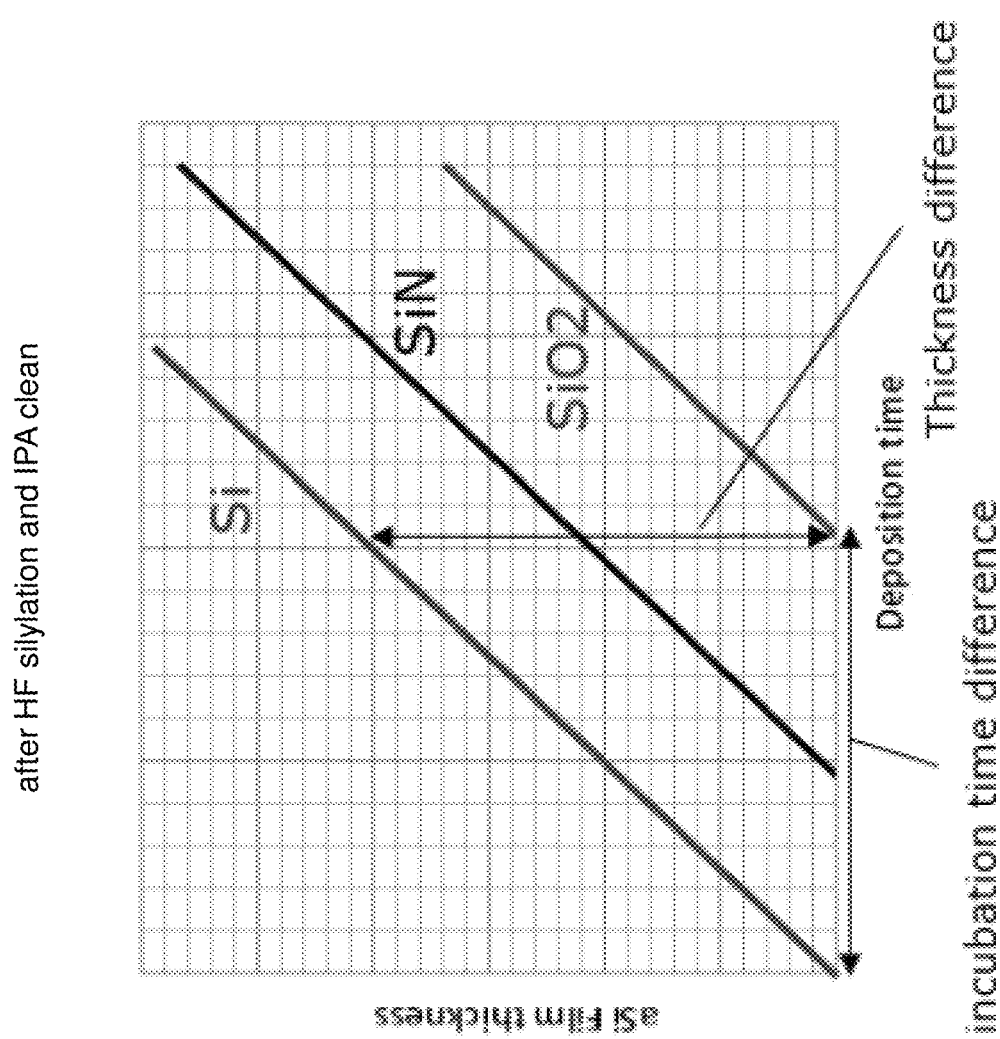
FIG. 14B is a graph illustrating comparison of nucleation times for silicon on surfaces of silicon, silicon oxide, and silicon nitride after HF preclean and an isopropyl alcohol drying process.

Referring to FIGS. 14A and 14B, dependence of the incubation time for amorphous silicon on the composition and the properties of the deposition surface is shown. FIG. 14A shows the thickness dependence on the deposition time for amorphous silicon films deposited on surfaces of silicon, silicon nitride, and silicon oxide that are not treated with any preclean process and are subsequently subjected to an amorphous silicon deposition process using low pressure chemical vapor deposition. In other words, a dilute hydrogen fluoride treatment is not used prior to deposition of the amorphous silicon films. The incubation time for the silicon surface is substantially zero. The silicon nitride surface displays a finite incubation time, which may be in a range from 3 seconds to 60 seconds depending on the processing conditions of the low pressure chemical vapor deposition process. The silicon oxide surface displays a greater incubation time than the silicon nitride surface.

FIG. 14B shows the thickness dependence on the deposition time for amorphous silicon films deposited on surfaces of silicon, silicon nitride, and silicon oxide that are treated with a dilute hydrofluoric acid preclean process and are subsequently subjected to an amorphous silicon deposition process using low pressure chemical vapor deposition. Specifically, a dilute hydrogen fluoride treatment followed by a drying process using isopropyl alcohol (IPA) is used prior to deposition of the amorphous silicon film. The incubation time for the silicon surface is substantially zero. The dilute hydrofluoric acid-treated silicon nitride surface displays a greater incubation time than the incubation time for an untreated silicon nitride surface (i.e., without the preclean process) shown in FIG. 14A. The dilute hydrofluoric acid-treated silicon oxide surface displays a greater incubation time than an untreated silicon oxide surface (i.e., without the preclean process) shown in FIG. 14A.

Generally, the low pressure chemical vapor deposition process that deposits the semiconductor material (such as amorphous silicon) on the physically exposed surfaces of the pedestal channel portions 11 and the semiconductor channel layers 601 may be terminated before onset of deposition of the semiconductor material on the cover dielectric material layers 607. In other words, the deposition time for the semiconductor material of the channel connection straps 603 may be less than the incubation time for the semiconductor material on the surfaces of the cover dielectric material layers 607.

In one embodiment, the cover dielectric material layer 607 includes silicon oxide, and a preclean using dilute hydrofluoric acid is performed prior to deposition of the semiconductor material of the channel connection straps 603 to maximize the incubation time for the cover dielectric material layer 607. The deposition time for formation of the channel connection straps 603 may be in a range from 30% to 100%, such as from 50% to 90%, of the incubation time for the semiconductor material on the surfaces of the cover dielectric material layer 607. For example, the deposition time for formation of the channel connection straps 603 may be in a range from 1 second to 30 seconds, such as from 2 seconds to 15 seconds, although lesser and greater deposition times may also be used. The channel connection straps 603 may grow isotropically from the physically exposed surfaces of the pedestal channel portions 11 and the semiconductor channel layers 601, and may have a thickness in a range from 2 nm to 30 nm, such as from 5 nm to 15 nm, although lesser and greater thicknesses may also be used. Each channel connection strap 603 is formed as a single continuous structure that provides an electrically conductive path between an underlying pedestal channel portion 11 and an overlying vertical semiconductor channel 60 within each memory opening 49.

Referring back to FIG. 5F, an alternative embodiment method may be used to form the channel connection straps 603. Specifically, a selective semiconductor deposition process may be used in lieu of a low pressure chemical vapor deposition process. In the selective semiconductor deposition process, a semiconductor precursor gas and an etchant are simultaneously or alternately flowed into a process chamber containing the exemplary structure. Specifically, a semiconductor precursor gas, an etchant, and an optional dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. The dopant gas, if used, includes atoms of dopants of the first conductivity type, which is the conductivity type of the pedestal channel portions 11. If the first conductivity type is p-type, diborane may be used as the dopant gas. If the first conductivity type is n-type, phosphine, arsine, or stibine may be used as the dopant gas. In case the dopant gas is not used, thermal diffusion of dopants of the first conductivity type from the pedestal channel portions 11 during a subsequent anneal process may cause the deposited semiconductor material to be doped with dopants of the first conductivity type. The etchant may include, for example, gas phase hydrogen chloride.

The selective semiconductor deposition process grows a doped semiconductor material having a doping of the first conductivity type or an undoped semiconductor material from physically exposed semiconductor surfaces, i.e., from the surfaces of the pedestal channel portions 11 and the semiconductor channel layers 601. The duration of the selective semiconductor deposition process may be selected such that a channel connection strap 603 is formed as a single continuous structure that provides an electrically conductive path between an underlying pedestal channel portion 11 and an overlying vertical semiconductor channel 60 within each memory opening 49. The channel connection straps 603 may have a thickness in a range from 2 nm to 50 nm, such as from 5 nm to 30 nm, although lesser and greater thicknesses may also be used. Within each memory opening fill structure 58, a channel connection strap 603 extends through an opening of a memory film 50 and electrically contacts an underlying pedestal channel portion 11 and an overlying vertical semiconductor channel 60. The channel connection strap 603 can have a topmost surface located under a horizontal plane HP1 including a top surface of the semiconductor channel layer 601. For example, the channel connection strap 603 can have a topmost surface located under a horizontal plane HP2 including a top surface of the sacrificial material layer 42 that will be replaced with a word line in a subsequent step, such as a top surface of a second spacer material layer (which may be a second sacrificial material layer 42) as counted from bottom among the alternating stack (32, 42) of the insulating layers 32 and the spacer material layers (which may be the sacrificial material layers 42).

Referring to FIG. 5G, a dielectric core layer 62L may be deposited in the memory cavity 49' to fill any remaining portion of the memory cavity 49' within each memory opening 49. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 5H, portions of the dielectric core layer 62L may be removed from outside the memory openings 49. For example, the horizontal portion of the dielectric core layer 62L may be removed, for example, by a recess etch from above the top surface of the insulating cap layer 70. The material of the dielectric core layer 62L and the cover dielectric material layers 607 may be further recessed below the horizontal plane including the top surface of the insulating cap layer 70 such that the recessed top surfaces of remaining portions of the dielectric core layer 62L are formed between the horizontal plane including the top surface of the insulating cap layer 70 and the horizontal plane including the bottom surface of the insulating cap layer 70. Each remaining portion of the dielectric core layer 62L constitutes a dielectric core 62.

Each vertical semiconductor channel 60 may be located entirety within a memory opening 49. A tunneling dielectric layer 56 may be surrounded by a charge storage layer 54, and may laterally surround a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5I:
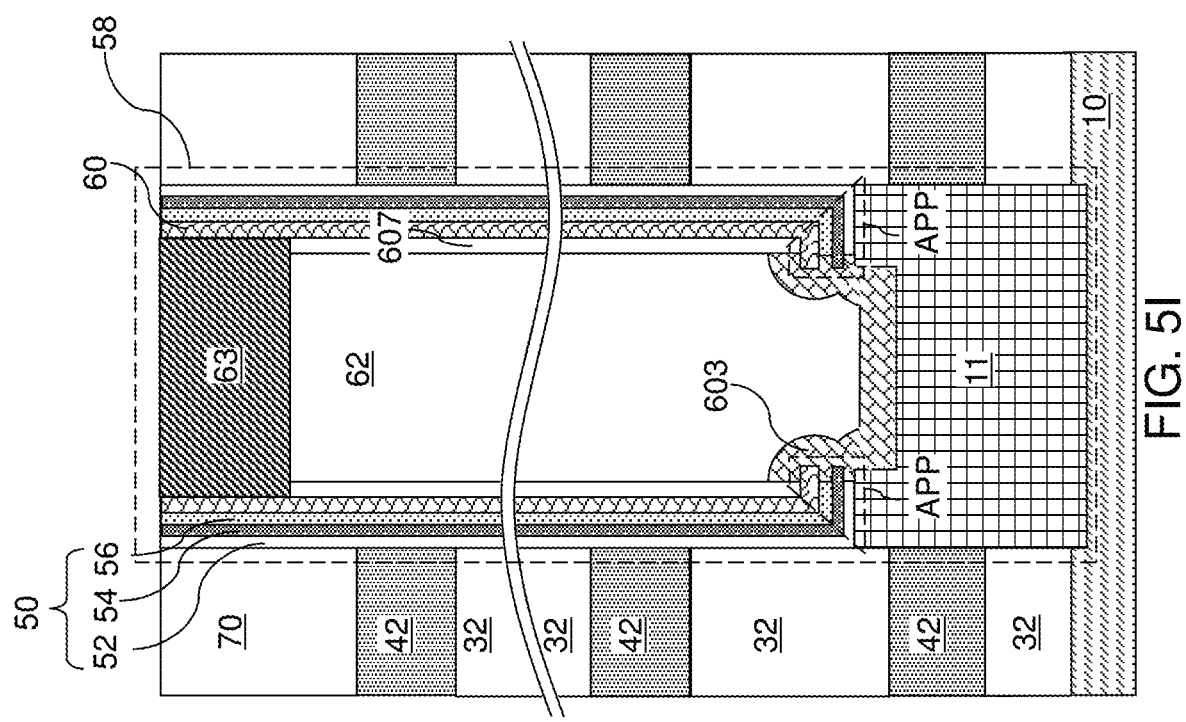

Referring to FIG. 5I, drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 may be a combination of a semiconductor channel, a tunneling dielectric layer, a plurality of memory elements comprises portions of the charge storage layer 54, and an optional blocking dielectric layer 52. Each combination of material portions that fill a memory opening 49 constitutes a memory opening fill structure 58. Each memory opening fill structure 58 comprises a pedestal channel portion 11, a channel connection strap 603, a memory stack structure 55, a dielectric core 62, and a drain region 63 within a memory opening 49. Each support opening 19 is filled with a respective combination of a pedestal channel portion 11, a channel connection strap 603, a memory stack structure 55, a dielectric core 62, and a drain region 63, which is herein referred to as a support pillar structure.

Figure 6:
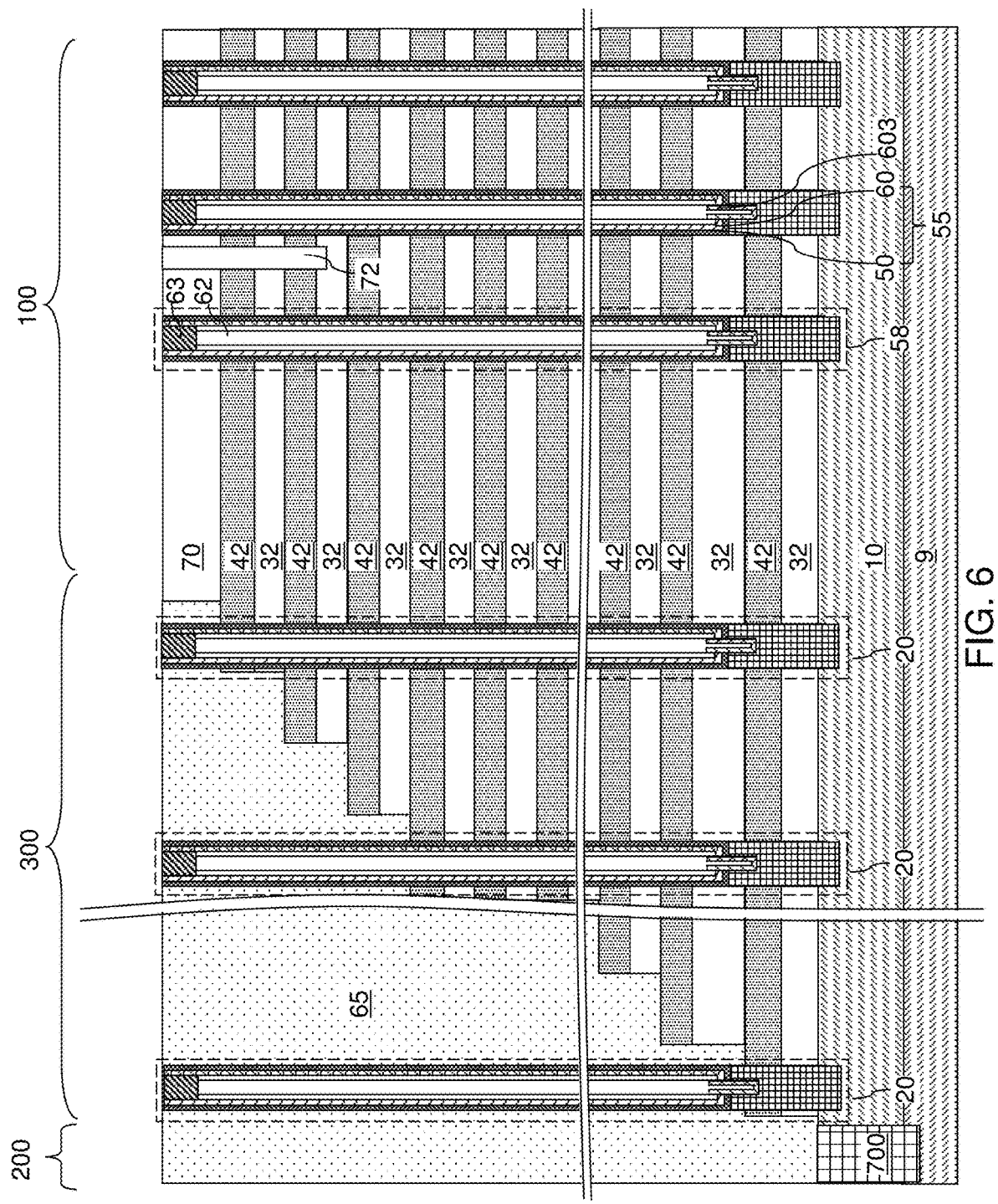
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60, a vertical stack of charge storage regions (comprises a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Figure 7A:
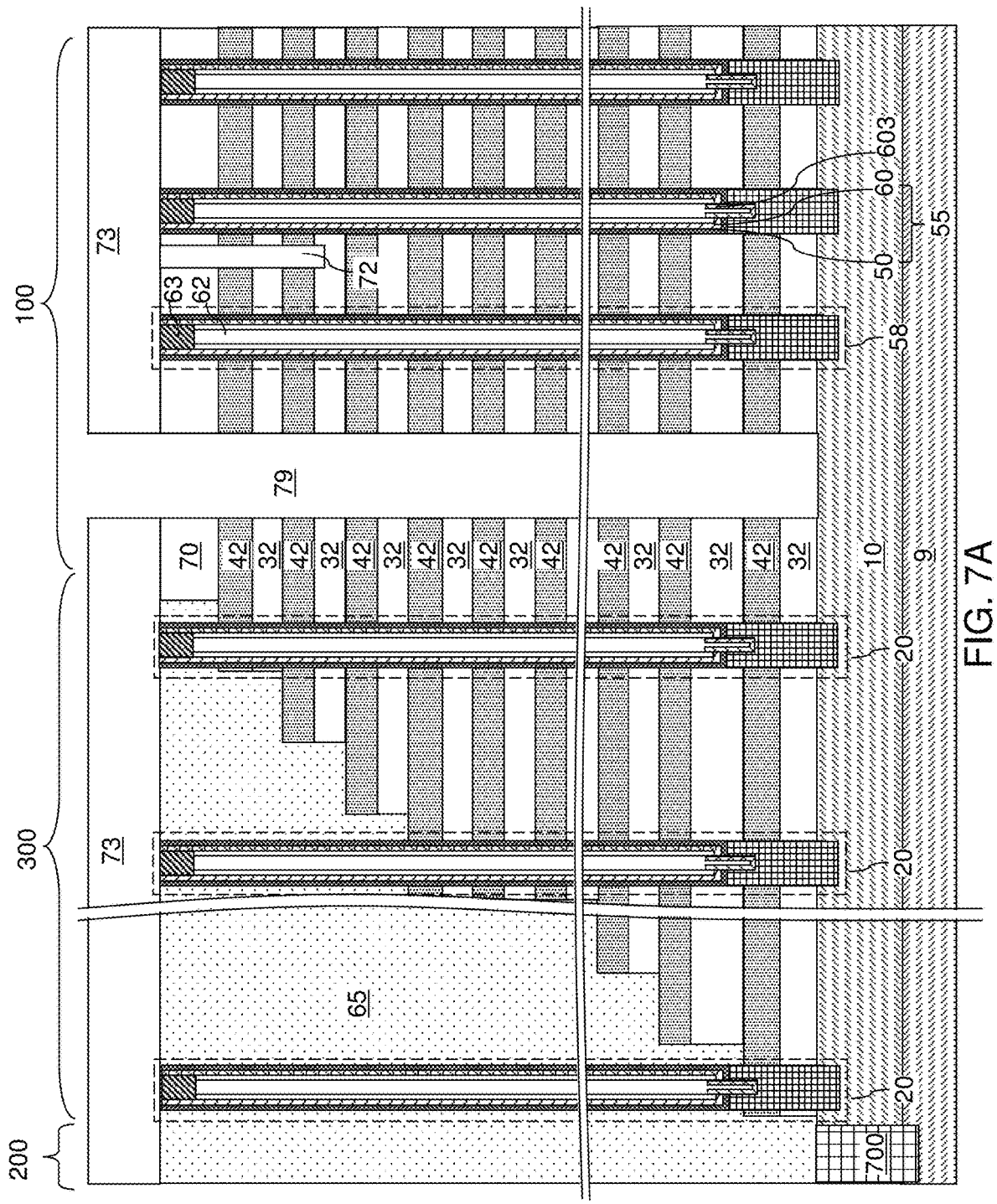
FIG. 7A is a schematic vertical cross-sectional view of the exemplary structure after formation of backside trenches according to an embodiment of the present disclosure.
Figure 7B:
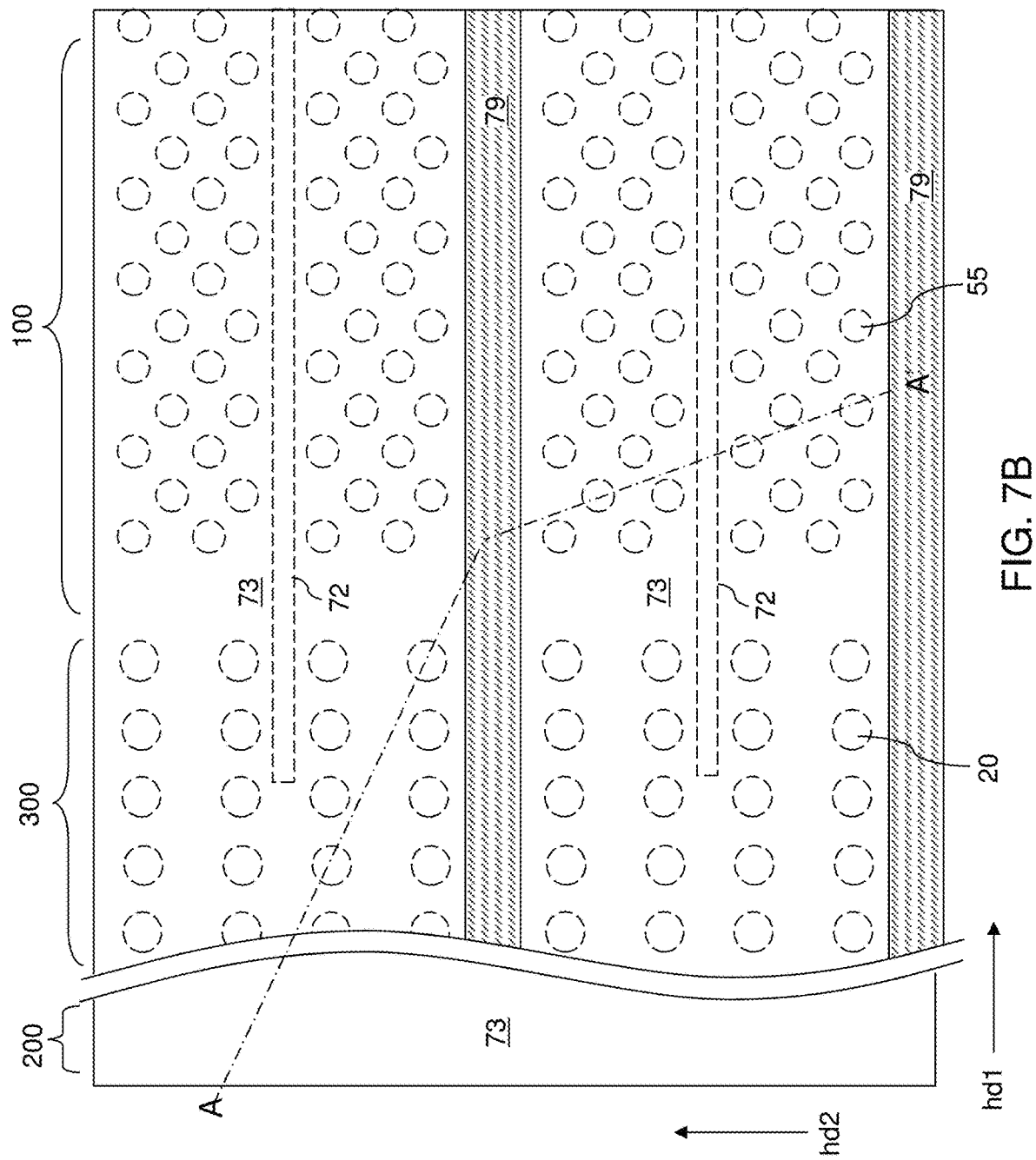
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and may be lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 8:
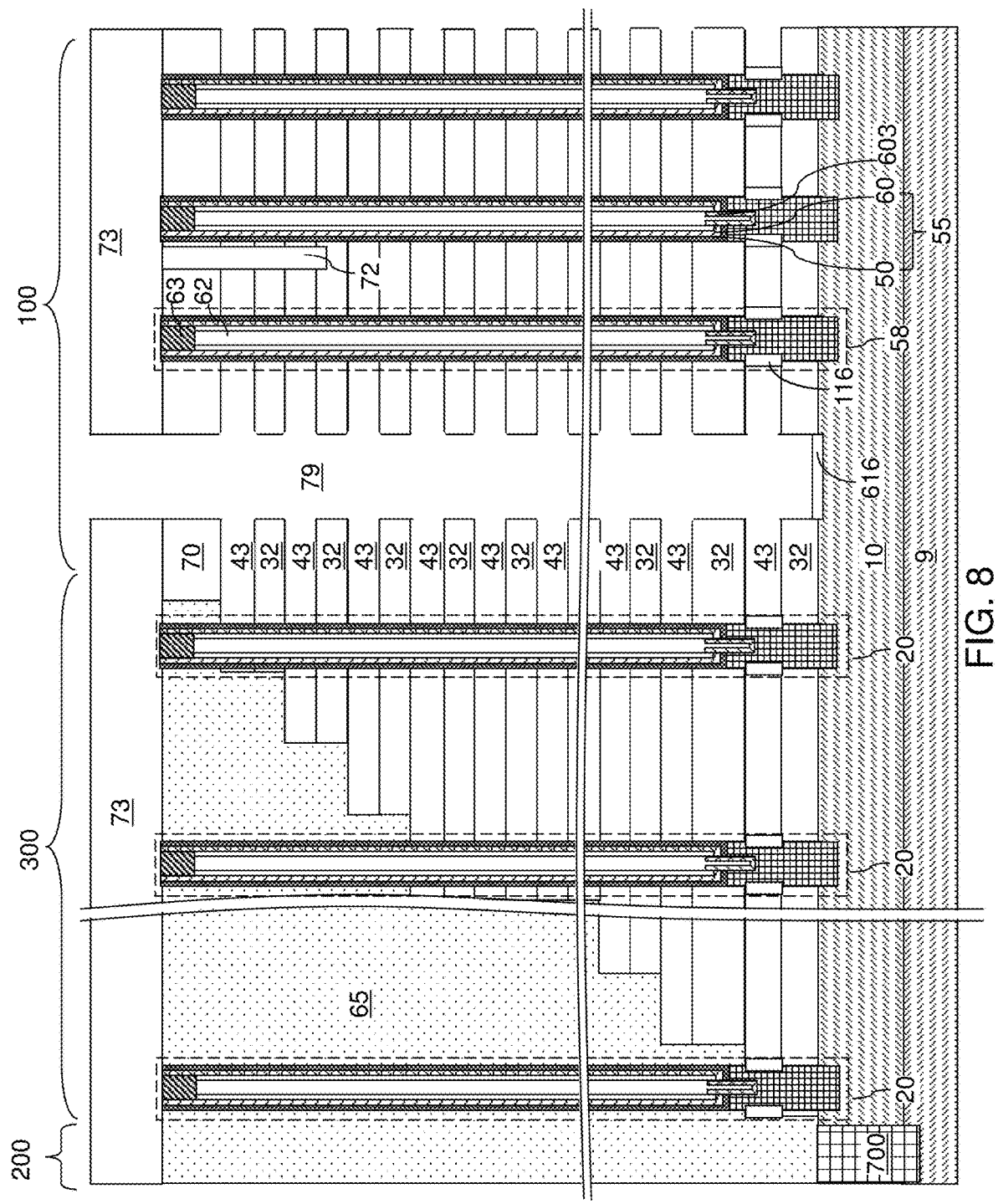
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 may be introduced into the backside trenches 79, for example, using an etch process. FIG. 9A illustrates a magnified region of the exemplary structure of FIG. 8. Backside recesses 43 are formed in volumes from which the sacrificial material layers 42 may be removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 may be formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the pedestal channel portions 11 and the semiconductor material layer 10 may be converted into dielectric material portions by thermal conversion and/or plasma conversion of the semiconductor materials to dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 9B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figures 9C, 9D:
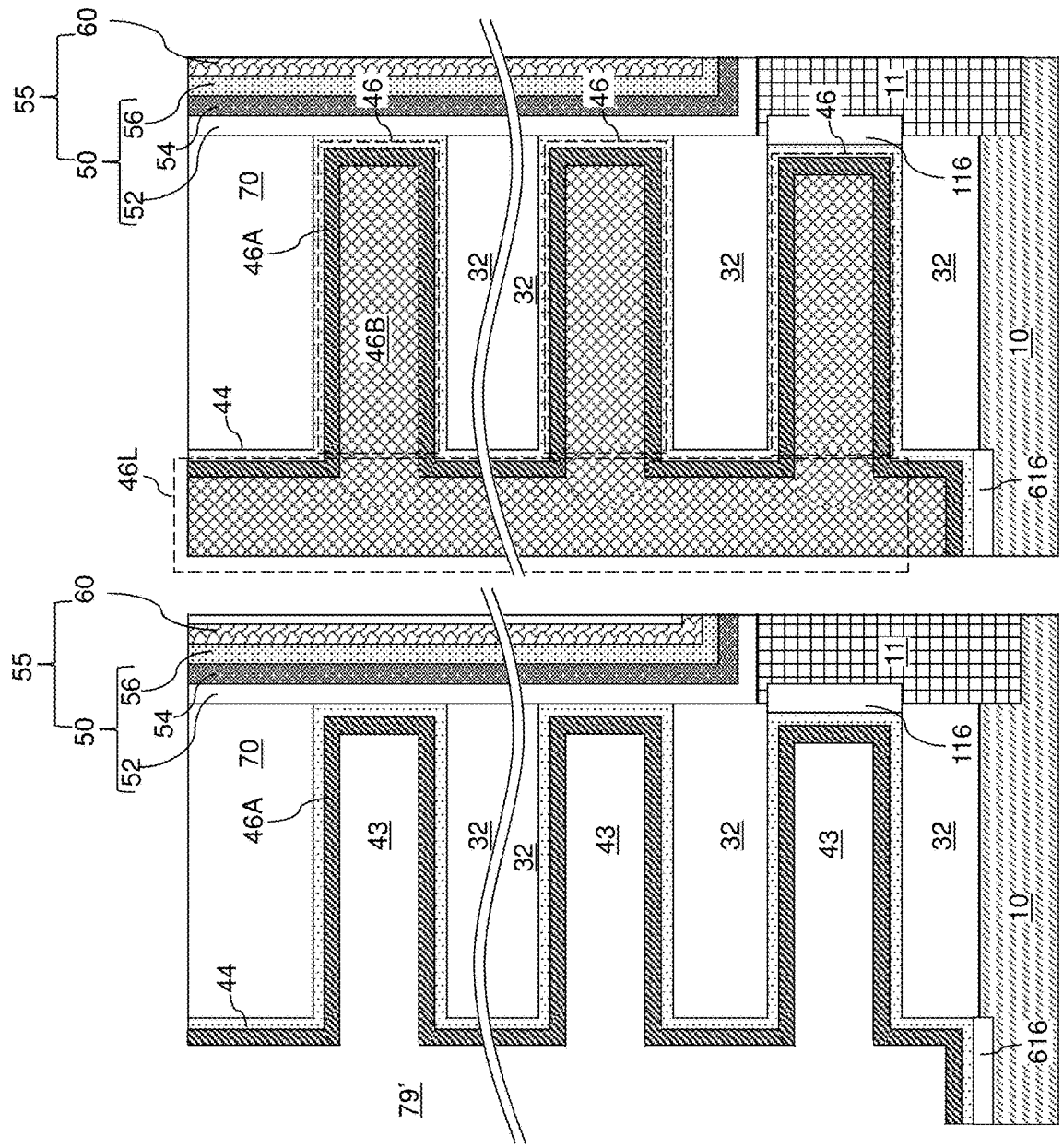

Referring to FIG. 9C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 10:
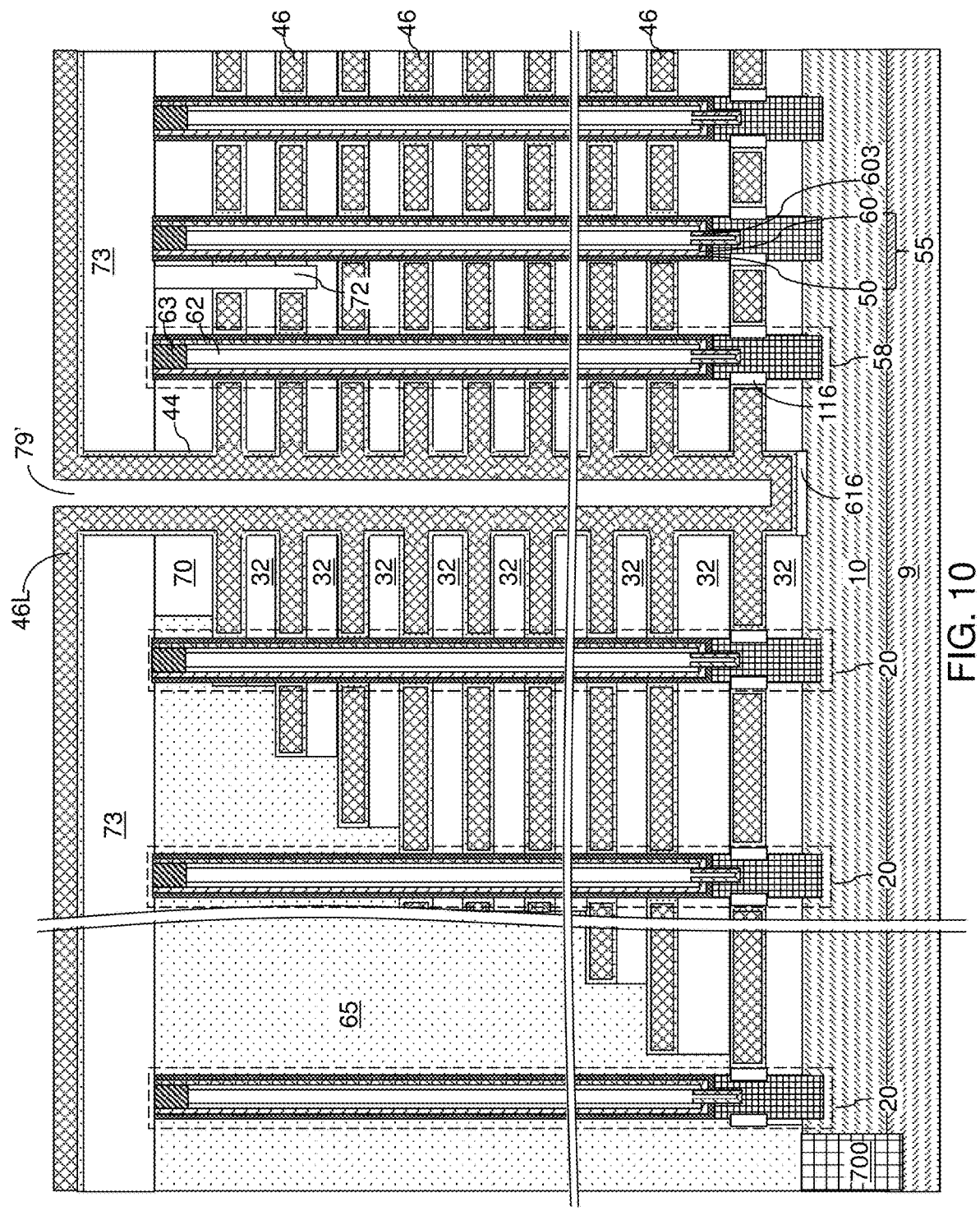
FIG. 10 is a schematic vertical cross-sectional view of the exemplary structure at the processing step of FIG. 9D.

Referring to FIGS. 9D and 10, a metal fill material may be deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
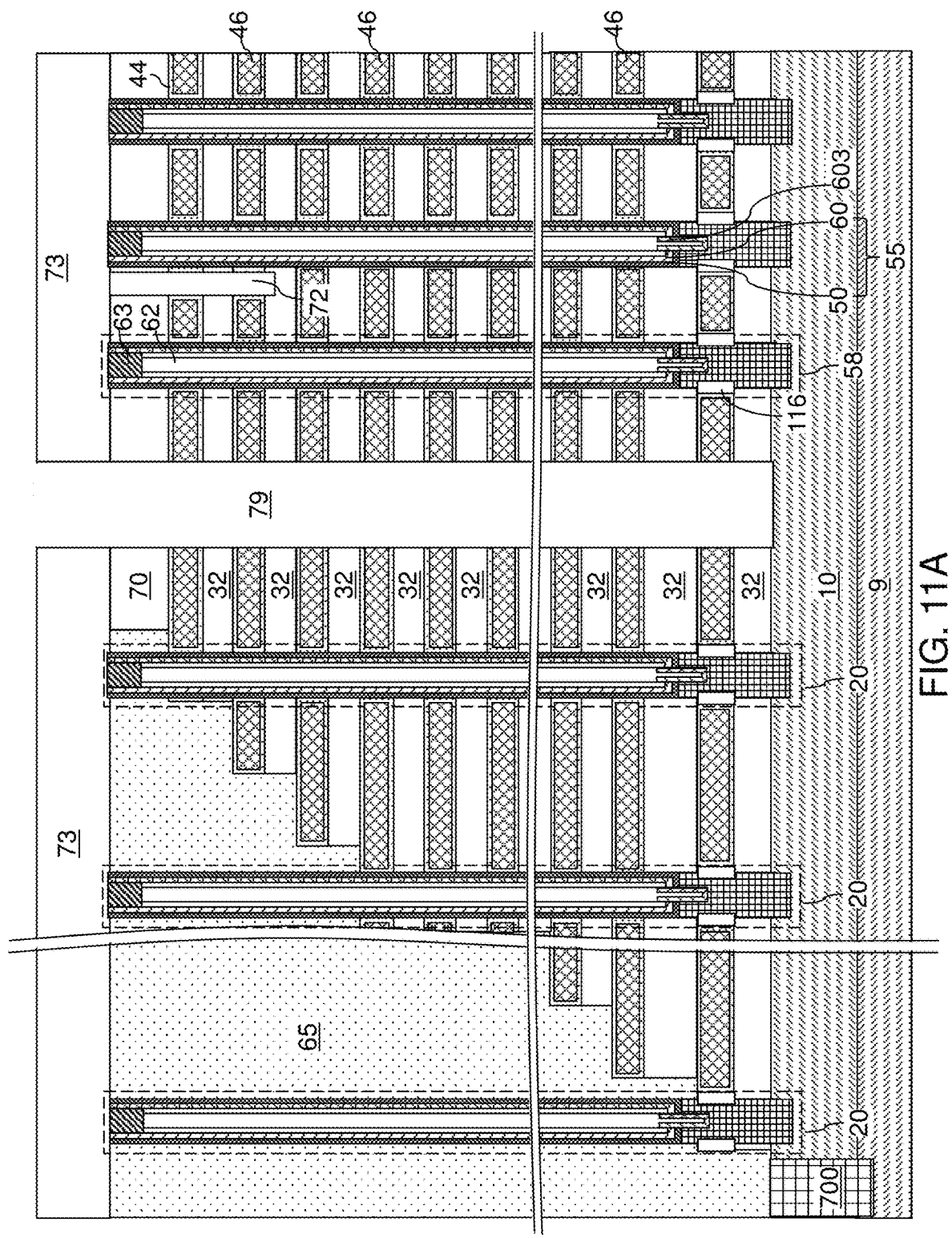
FIG. 11A is a schematic vertical cross-sectional view of the exemplary structure after removal of a deposited conductive material from within the backside trench according to an embodiment of the present disclosure.
Figure 11B:
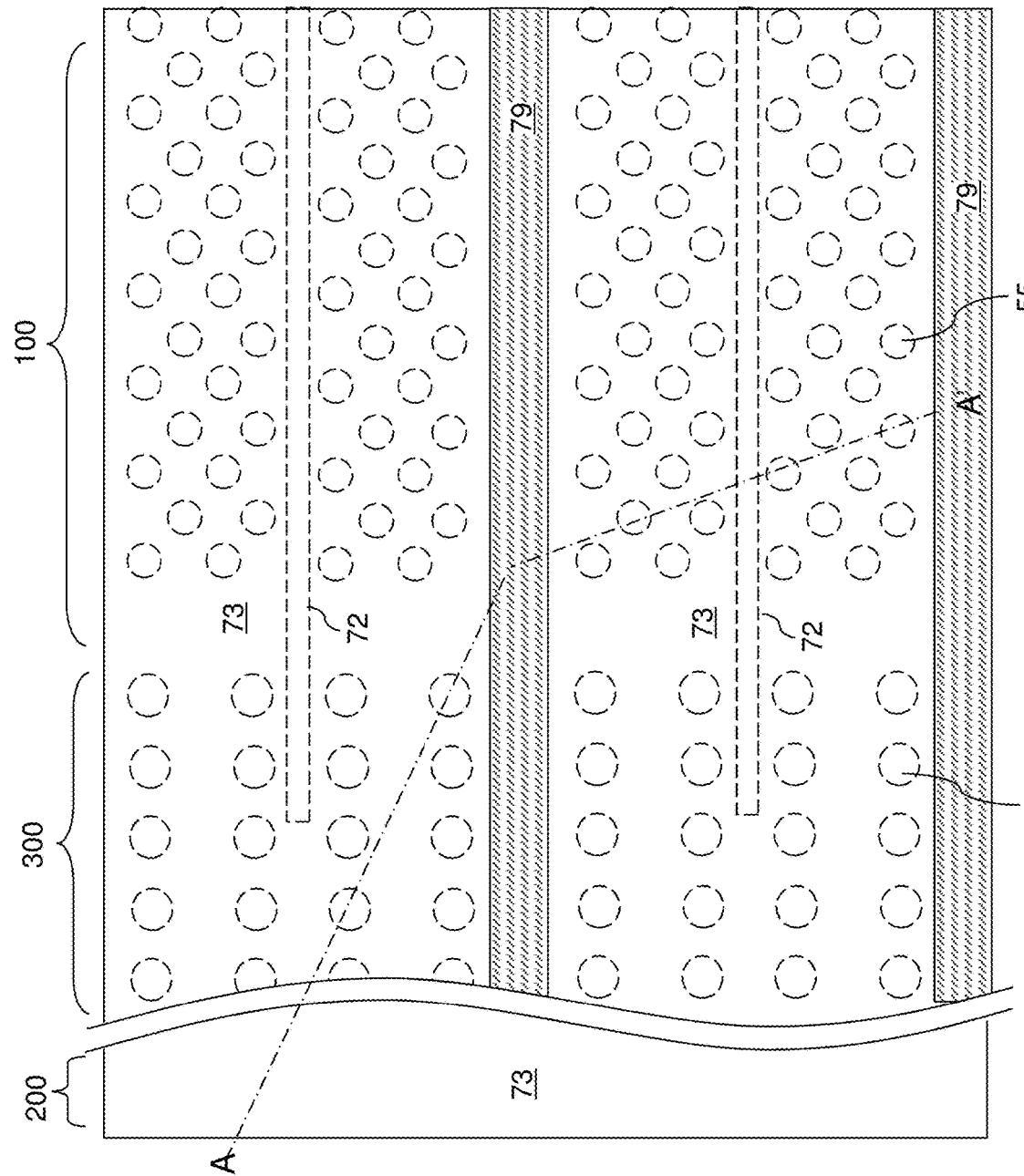
FIG. 11B is a partial see-through top-down view of the exemplary structure of FIG. 11A. The vertical plane A-A' is the plane of the schematic vertical cross-sectional view of FIG. 11A.

Referring to FIG. 11, the deposited metallic material of the continuous electrically conductive material layer 46L may be etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 may be replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' is present within each backside trench 79.

Figure 12A:
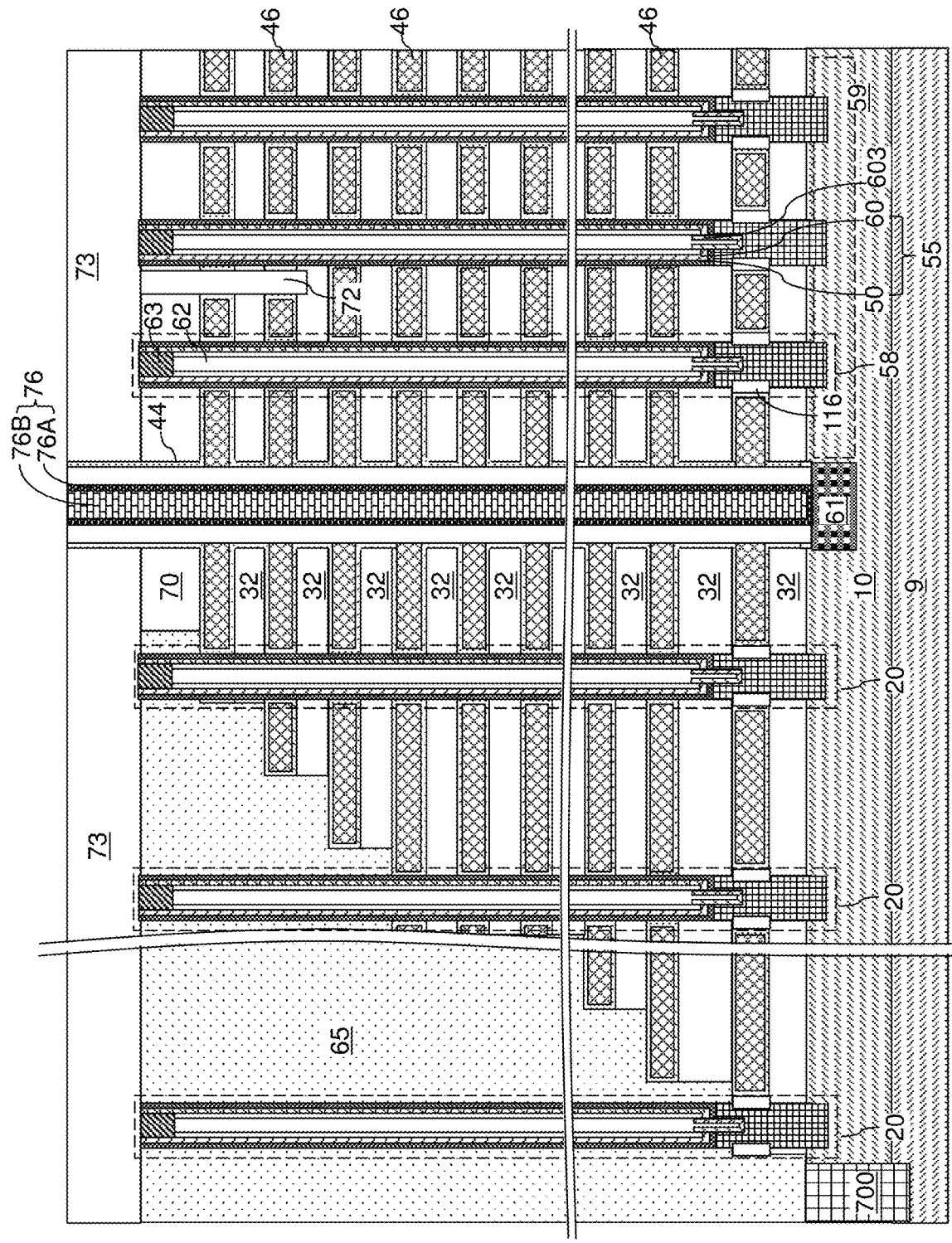
FIG. 12A is a schematic vertical cross-sectional view of the exemplary structure after formation of an insulating spacer and a backside contact structure according to an embodiment of the present disclosure.
Figure 12B:
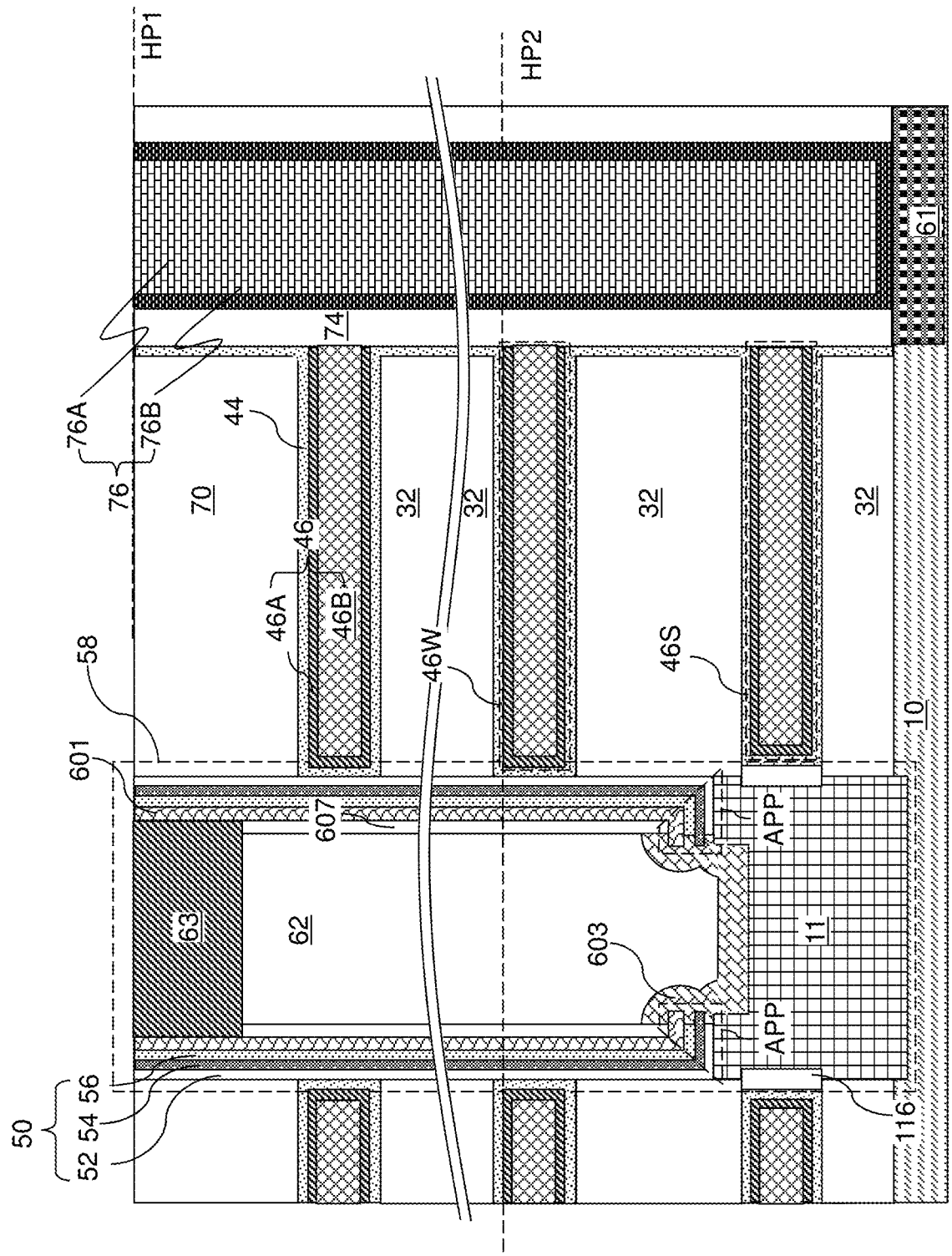
FIG. 12B is a magnified view of a region of the exemplary structure of FIG. 12A.

Referring to FIGS. 12A and 12B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 603, 60) extend between each source region 61 and a respective set of drain regions 63. The semiconductor channels (59, 11, 603, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Within each memory opening fill structure 58, a channel connection strap 603 extends through an opening of a memory film 50 and electrically contacts an underlying pedestal channel portion 11 and an overlying vertical semiconductor channel 60. As shown in FIG. 12B, the channel connection strap 603 can have a topmost surface located under a horizontal plane HP1 including a top surface of the vertical semiconductor channel 60. In other words, the vertical semiconductor channel 60 extends higher in the vertical direction away from the substrate than the channel connection strap 603. In one embodiment, the channel connection strap 603 can have a topmost surface located under a horizontal plane HP1 including a top surface of any given electrically conductive layer 46W that functions as a word line. In other words, the topmost surface of the channel connection strap may be above the electrically conductive layer 46S that functions as a source select gate, but below one of the word lines, such as the word line closest to the substrate, For example, if NAND device contains only one source select gate in the vertical direction, then the channel connection strap 603 can have a topmost surface located under a horizontal plane HP2 including a top surface of a second electrically conductive layer 46W as counted from bottom of the alternating stack (32, 46) of the insulating layers 32 and the electrically conductive layers 46.

Figure 13A:
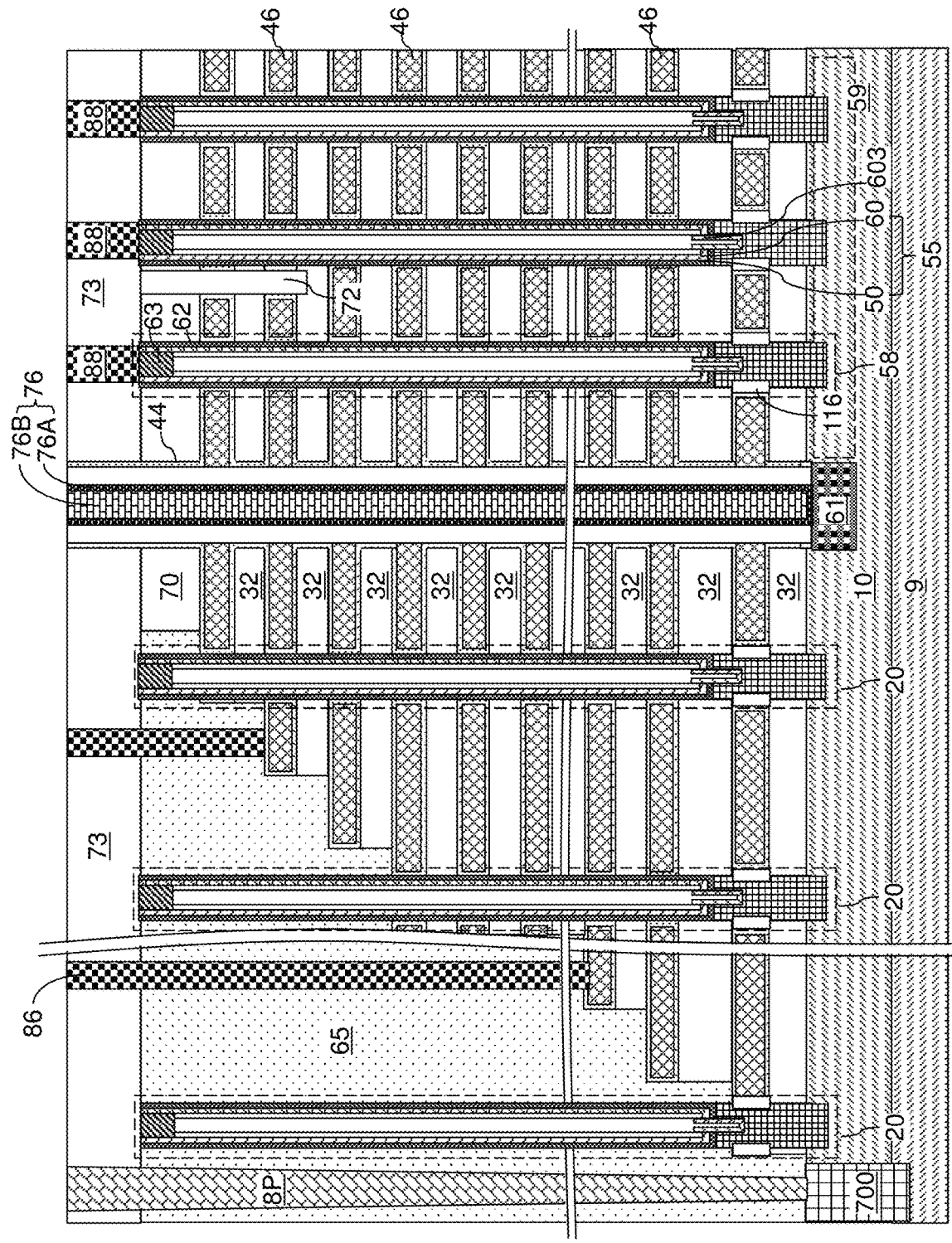
FIG. 13A is a schematic vertical cross-sectional view of the exemplary structure after formation of additional contact via structures according to an embodiment of the present disclosure.
Figure 13B:
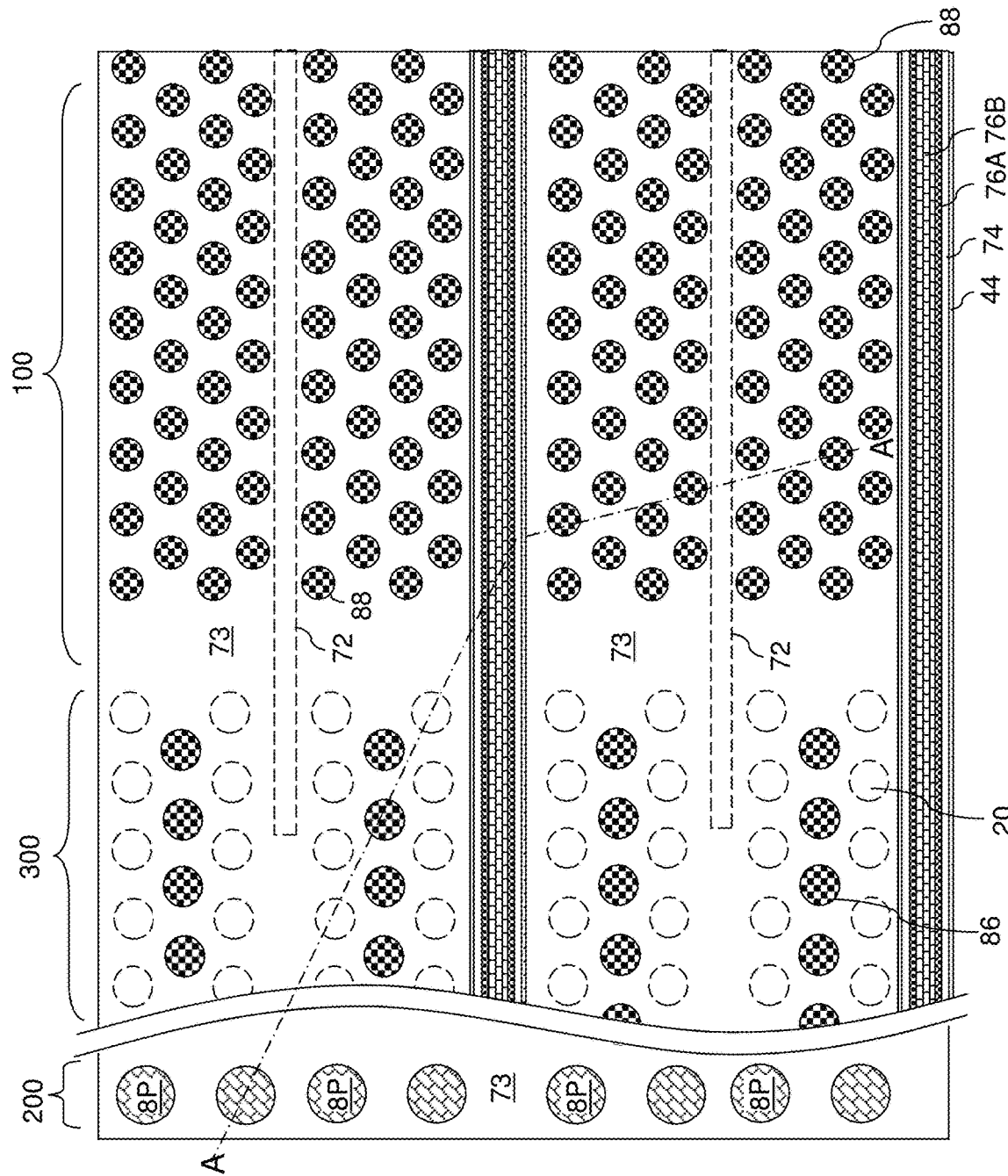
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices.

Referring to all drawings and according to various embodiments of the present disclosure, a three-dimensional memory device is provided, which comprises: an alternating stack of insulating layers 32 and electrically conductive layers 46 located over a substrate (9, 10); a memory opening 49 extending through the alternating sack (32, 46); and a memory opening fill structure 58 located within the memory opening 49, wherein the memory opening fill structure 58 comprises a pedestal channel portion 11, a memory film 50 overlying the pedestal channel portion 11, a vertical semiconductor channel 60 located inside the memory film 50, and a channel connection strap 603 that extends through an opening of the memory film 50 and contacting the pedestal channel portion 11 and the vertical semiconductor channel 60. The channel connection strap 603 may have a topmost surface located below a horizontal plane HP1 including a top surface of the vertical semiconductor channel 60, as shown in FIG. 12B.

In one embodiment, the channel connection strap 603 may have a different composition from the compositions of the pedestal channel portion 11 and from the vertical semiconductor channel 60, for example, by a different atomic concentration of dopants of the first conductivity type therein. Additionally, or alternatively, a microscopic interface such as an interfacial semiconductor oxide layer may be present between the pedestal channel portion 11 and the vertical semiconductor channel 60.

In one embodiment, the channel connection strap 603 may have a material composition that is different from a material composition of the vertical semiconductor channel 60.

In one embodiment, the channel connection strap 603 may have a horizontal portion with a uniform thickness between a top surface of the horizontal portion and a bottom surface of the horizontal portion, wherein the uniform thickness is different from a lateral thickness of the vertical semiconductor channel between an inner sidewall and an outer sidewall thereof.

In one embodiment, the memory film 50 comprises: a tubular memory film portion (i.e., a vertically-extending portion) vertically extending through multiple layers of the alternating stack (32, 46); and an annular plate memory film portion adjoined to a bottom end of the tubular memory film portion and including the opening of the memory film 50.

In one embodiment, the vertical semiconductor channel 60 comprises: a tubular semiconductor material portion (i.e., a vertically-extending portion) vertically extending through the multiple layers of the alternating stack (32, 46) and including an outer cylindrical sidewall that contacts an inner cylindrical sidewall of the tubular memory film portion; and a bottom cap semiconductor material portion adjoined to a bottom end of the tubular vertical semiconductor material portion and contacting a top surface of the channel connection strap 603.

In one embodiment, the channel connection strap 603 comprises: a horizontal portion contacting a bottom surface of the vertical semiconductor channel 60; and an annular vertically-extending portion contacting a lower portion of a sidewall of the vertical semiconductor channel 60.

In one embodiment, the memory film 50 comprises: a blocking dielectric layer 52 contacting a sidewall of the memory opening 49; a charge storage layer 54 contacting the blocking dielectric layer 52; and a tunneling dielectric layer 56 contacting the vertical semiconductor channel 60.

In one embodiment, each of the blocking dielectric layer 52, the charge storage layer 54, and the tunneling dielectric layer 56 comprises a respective tubular portion and a respective annular plate portion adjoined to a bottom end of the respective tubular portion; and the annular plate portion of the charge storage layer 54 has a narrower opening than an opening through the annular plate portion of the blocking dielectric layer 52, and than an opening through the annular plate portion of the tunneling dielectric layer 56.

In one embodiment, the vertical semiconductor channel 60 contacts an inner sidewall of the memory film 50 and contacts a first outer sidewall of the channel connection strap 603. A cover dielectric material layer 607 can contact an inner sidewall of the vertical semiconductor channel 60, and can contact a second outer sidewall of the channel connection strap 603 that overlies the first outer sidewall of the channel connection strap 603 and is laterally offset outward with respective to the first outer sidewall of the channel connection strap 603. An annular bottom surface of the channel connection strap 603 can contact an annular top surface of the vertical semiconductor channel 60. Further, an annular top surface of the channel connection strap 603 can contact an annular bottom surface of the vertical semiconductor channel 60 that underlies the annular top surface of the vertical semiconductor channel 60.

In one embodiment, the pedestal channel portion 11, the channel connection strap 603, and the vertical semiconductor channel 60 have a doping of a first conductivity type; a dielectric core 62 is located inside and contacting the cover dielectric layer 607, and the dielectric core 62 is located over the channel connection strap 603 in the memory opening 49; and a drain region 63 having a doping of a second conductivity type contacts an upper end of the vertical semiconductor channel 60.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46) to provide stepped surfaces; a retro-stepped dielectric material portion 65 overlies the stepped surface in the terrace region; and contact via structures (such as word line contact via structures 86) extend through the retro-stepped dielectric material portion 65 and contacts a respective one of the electrically conductive layers 46.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprises a portion of a charge storage layer 54 at a level of an electrically conductive layer 46) in a first device level of the array of monolithic three-dimensional NAND strings may be located over another memory cell (comprises another portion of the charge storage layer 54 at a level of another electrically conductive layer 46) in a second device level of the array of monolithic three-dimensional NAND strings. The silicon substrate may contain an integrated circuit comprising a driver circuit (comprises a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 603, 60), wherein at least one end portion (such as the vertical semiconductor channel 60) of each of the plurality of semiconductor channels (59, 11, 603, 60) extends substantially perpendicular to a top surface of the substrate (9, 10) and comprising a respective one of the vertical semiconductor channels 60; and a plurality of charge storage elements (comprises portions of the memory films 50, i.e., portions of the charge storage layer 54). Each charge storage element may be located adjacent to a respective one of the plurality of semiconductor channels (59, 11, 603, 60).

The channel connection strap 603 of the embodiments of the present disclosure may be used to provide a robust electrical connection between the pedestal channel portions 11 and the vertical semiconductor channels 60. The thickness of the vertical semiconductor channel 60 can be optimized independently of the thickness of the channel connection strap 603. In one embodiment, the total thickness of the vertical portion of the semiconductor channel may be in a range from 2 nm to 7 nm to allow full control of the semiconductor channel by the electrically conductive layers 46 with enhanced on-current and off-current characteristics. Furthermore, in one embodiment, the thinner vertical semiconductor channel may have a larger grain size after a crystallization anneal which recrystallizes the amorphous silicon of vertical semiconductor channel and the channel connection strap into large grain polysilicon material, which improves the conductivity of the channel.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
a memory opening extending through the alternating stack; and
a memory opening fill structure located within the memory opening, wherein the memory opening fill structure comprises:
a pedestal channel portion;
a memory film overlying the pedestal channel portion;
a vertical semiconductor channel located inside the memory film; and
a channel connection strap that extends through an opening of the memory film and electrically contacts the pedestal channel portion and the vertical semiconductor channel, and the channel connection strap having a topmost surface located below a horizontal plane including a top surface of the vertical semiconductor channel, wherein the channel connection strap has a material composition that is different from a material composition of the vertical semiconductor channel.

2. The three-dimensional memory device of claim 1, wherein the channel connection strap has a horizontal portion with a uniform thickness between a top surface of the horizontal portion and a bottom surface of the horizontal portion, wherein the uniform thickness is different from a lateral thickness of the vertical semiconductor channel between an inner sidewall and an outer sidewall thereof.

3. The three-dimensional memory device of claim 1, wherein the memory film comprises:
a tubular memory film portion vertically extending through multiple layers of the alternating stack; and
an annular plate memory film portion adjoined to a bottom end of the tubular memory film portion and including the opening of the memory film.

4. The three-dimensional memory device of claim 3, wherein the vertical semiconductor channel comprises:
a tubular semiconductor material portion vertically extending through the multiple layers of the alternating stack and including an outer cylindrical sidewall that contacts an inner cylindrical sidewall of the tubular memory film portion; and
a bottom cap semiconductor material portion adjoined to a bottom end of the tubular vertical semiconductor material portion and contacting the channel connection strap.

5. The three-dimensional memory device of claim 1, wherein the channel connection strap comprises:
a horizontal portion contacting a bottommost surface of the vertical semiconductor channel; and
an annular vertically-extending portion contacting a lower portion of a sidewall of the vertical semiconductor channel.

6. The three-dimensional memory device of claim 1, wherein the memory film comprises:
a blocking dielectric layer contacting a sidewall of the memory opening;
a charge storage layer contacting the blocking dielectric layer; and
a tunneling dielectric layer contacting the vertical semiconductor channel.

7. The three-dimensional memory device of claim 6, wherein:
each of the blocking dielectric layer, the charge storage layer, and the tunneling dielectric layer comprises a respective tubular portion and a respective annular plate portion adjoined to a bottom end of the respective tubular portion; and
the annular plate portion of the charge storage layer has a narrower opening than an opening through the annular plate portion of the blocking dielectric layer and than an opening through the annular plate portion of the tunneling dielectric layer.

8. The three-dimensional memory device of claim 6, wherein:
a sidewall of the tunneling dielectric layer is laterally recessed outward relative to a sidewall of the vertical semiconductor channel that contacts the channel connection strap;
the channel connection strap contacts an annular bottom surface of the vertical semiconductor channel; and
a sidewall of the blocking dielectric layer is laterally recessed outward relative to a sidewall of the charge storage layer.

9. The three-dimensional memory device of claim 1, wherein the vertical semiconductor channel contacts an inner sidewall of the memory film and contacts a first outer sidewall of the channel connection strap.

10. The three-dimensional memory device of claim 9, further comprising a cover dielectric material layer contacting an inner sidewall of the vertical semiconductor channel and contacting a second outer sidewall of the channel connection strap that overlies the first outer sidewall of the channel connection strap.

11. The three-dimensional memory device of claim 10, wherein:
the pedestal channel portion, the channel connection strap, and the vertical semiconductor channel have a doping of a first conductivity type;
a dielectric core is located inside and contacting the cover dielectric layer and is located over the channel connection strap in the memory opening; and
a drain region having a doping of a second conductivity type contacts an upper end of the vertical semiconductor channel.

12. The three-dimensional memory device of claim 1, wherein:
the alternating stack comprises a terrace region in which each electrically conductive layer other than a topmost electrically conductive layer within the alternating stack laterally extends farther than any overlying electrically conductive layer within the alternating stack to provide stepped surfaces;
a retro-stepped dielectric material portion overlies the stepped surface in the terrace region; and
contact via structures extend through the retro-stepped dielectric material portion and contacts a respective one of the electrically conductive layers.

13. A three-dimensional memory device comprising:
an alternating stack of insulating layers and electrically conductive layers located over a substrate;
a memory opening extending through the alternating stack; and
a memory opening fill structure located within the memory opening, wherein the memory opening fill structure comprises:
a pedestal channel portion;
a memory film overlying the pedestal channel portion;
a vertical semiconductor channel located inside the memory film; and
a channel connection strap that extends through an opening of the memory film and electrically contacts the pedestal channel portion and the vertical semiconductor channel, wherein a topmost surface of the channel connection strap protrudes above a top surface of an annular bottom portion of the memory film by a height that is greater than a thickness of the vertical semiconductor channel.

14. The three-dimensional memory device of claim 13, wherein:
the vertical semiconductor channel comprises a tubular semiconductor material portion vertically extending through multiple layers of the alternating stack and including an outer cylindrical sidewall and an inner cylindrical sidewall, and a bottom cap semiconductor material portion having a top surface that is adjoined to a bottom periphery of the inner cylindrical sidewall of the vertical semiconductor channel and contacts the channel connection strap; and
a topmost surface of the channel connection strap protrudes above a horizontal plane including the top surface of the bottom cap semiconductor material portion of the vertical semiconductor channel.

15. The three-dimensional memory device of claim 14, wherein:

the topmost surface of the channel connection strap is laterally spaced from the tubular semiconductor material portion by a cover dielectric layer that contacts the inner cylindrical sidewall of the tubular semiconductor material portion of the vertical semiconductor channel; and the cover dielectric layer contacts a sidewall of the channel connection strap that is adjoined to an outer periphery of the topmost surface of the channel connection strap.

16. The three-dimensional memory device of claim 13, wherein the channel connection strap has a material composition that is different from a material composition of the vertical semiconductor channel.

17. The three-dimensional memory device of claim 13, wherein the channel connection strap comprises:

a horizontal portion contacting a bottommost surface of the vertical semiconductor channel; and an annular vertically-extending portion contacting a lower portion of a sidewall of the vertical semiconductor channel.

18. A three-dimensional memory device comprising:

an alternating stack of insulating layers and electrically conductive layers located over a substrate;

a memory opening extending through the alternating stack; and a memory opening fill structure located within the memory opening, wherein the memory opening fill structure comprises:

a pedestal channel portion;

a memory film overlying the pedestal channel portion;

a vertical semiconductor channel located inside the memory film; and a channel connection strap that extends through an opening of the memory film and electrically contacts the pedestal channel portion and the vertical semiconductor channel, wherein the channel connection strap is not a portion of the vertical semiconductor strap and is not a portion of the pedestal channel portion, and contacts the channel connection strap at a first interface and contacts the pedestal channel portion at a second interface.

19. The three-dimensional memory device of claim 18, wherein the channel connection strap has a material composition that is different from a material composition of the vertical semiconductor channel.

20. The three-dimensional memory device of claim 18, wherein a topmost surface of the channel connection strap protrudes above a top surface of an annular bottom portion of the memory film by a height that is greater than a thickness of the vertical semiconductor channel.

* * * * *